US012696566B2

(12) United States Patent
    Kim et al.

(10) Patent No.:     US 12,696,566 B2
(45) Date of Patent:          Jul. 28, 2026

(54) IMAGE SENSOR INCLUDING POLARIZATION PATTERNS

(71) Applicant: SAMSUNG ELECTRONICS CO., LTD., Suwon-si (KR)

(72) Inventors: Sanghoon Kim, Suwon-si (KR); Jonguk Kim, Suwon-si (KR); Heegeun Jeong, Suwon-si (KR)

(73) Assignee: SAMSUNG ELECTRONICS CO., LTD., Suwon-si (KR)

( * ) Notice:   Subject to any disclaimer, the term of this patent is extended or adjusted under 35 U.S.C. 154(b) by 484 days.

(21) Appl. No.: 18/207,786

(22) Filed:      Jun. 9, 2023

(65)                  Prior Publication Data

US 2024/0120357 A1        Apr. 11, 2024

(30)          Foreign Application Priority Data

Oct. 6, 2022     (KR) ......................... 10-2022-0128035

(51) Int. Cl.
       *H10F 39/00*          (2025.01)
       *H10F 39/18*          (2025.01)
(52) U.S. Cl.
       CPC ......... *H10F 39/806* (2025.01); *H10F 39/024* (2025.01); *H10F 39/182* (2025.01); *H10F 39/8053* (2025.01); *H10F 39/8063* (2025.01); *H10F 39/807* (2025.01)
(58) Field of Classification Search
       None
       See application file for complete search history.

(56)                  References Cited

U.S. PATENT DOCUMENTS

| | | | |
|---|---|---|---|
| 10,367,020 B2 | 7/2019 | Cheng et al. | |
| 11,367,743 B2 * | 6/2022 | Yang ................... | H10F 39/8053 |
| 2015/0206912 A1 | 7/2015 | Kanamori et al. | |
| 2016/0337575 A1 | 11/2016 | Akiyama | |
| 2017/0077163 A1 | 3/2017 | Chou et al. | |
| 2018/0213170 A1 | 7/2018 | Segawa et al. | |
| 2018/0302597 A1 | 10/2018 | Honda | |

(Continued)

FOREIGN PATENT DOCUMENTS

| | | |
|---|---|---|
| JP | 2019-040965 A | 3/2019 |
| JP | 2020126882 A | 8/2020 |

(Continued)

OTHER PUBLICATIONS

Noudo Shinichiro, Imaging Element and Method for Manufacturing Imaging Element. (Year: 2020).*

*Primary Examiner* — Nilufa Rahim
(74) *Attorney, Agent, or Firm* — Muir Patent Law, PLLC

(57)                  ABSTRACT

An image sensor includes a substrate having a plurality of first pixel regions configured to generate image information and a plurality of second pixel regions configured to detect phase information, a grid pattern on the substrate and dividing a plurality of spaces corresponding to each of the plurality of first pixel regions and the plurality of second pixel regions. The image sensor also includes a plurality of color filters respectively in first spaces of the plurality of spaces, excluding second spaces corresponding to the plurality of second pixel regions, a plurality of polarization patterns respectively in the second spaces and partitioning the second spaces, and a microlens layer including a plurality of first microlenses respectively on the plurality of color filters.

20 Claims, 21 Drawing Sheets

(56)    References Cited

U.S. PATENT DOCUMENTS

| | | | |
|---|---|---|---|
| 2020/0358971 A1* | 11/2020 | Shim | H10F 39/813 |
| 2021/0118931 A1 | 4/2021 | Matsunuma et al. | |
| 2021/0175270 A1* | 6/2021 | Pang | H10F 39/8023 |
| 2022/0336511 A1* | 10/2022 | Barbour | H10F 39/8063 |
| 2023/0314681 A1* | 10/2023 | Wang | H10F 39/18 |
| | | | 257/432 |
| 2024/0313019 A1* | 9/2024 | Kurihara | G02B 5/20 |

FOREIGN PATENT DOCUMENTS

| | | | |
|---|---|---|---|
| KR | 1020190106599 A | 9/2019 | |
| KR | 1020200037698 A | 4/2020 | |
| KR | 1020210054085 A | 5/2021 | |
| KR | 10-2354653 B1 | 1/2022 | |
| KR | 1020220072116 A | 6/2022 | |

* cited by examiner

'D'

1

IMAGE SENSOR INCLUDING POLARIZATION PATTERNS

CROSS-REFERENCE TO RELATED APPLICATION(S)

Korean Patent Application No. 10-2022-0128035, filed on Oct. 6, 2022, in the Korean Intellectual Property Office, is incorporated herein by reference in its entirety.

BACKGROUND

1. Field

An image sensor, particularly an image sensor having phase detection pixels is disclosed.

2. Description of the Related Art

Image sensors that capture images and convert the captured images into electrical signals may also be used in cameras mounted in automobiles, security devices, and robots, as well as in general electronic devices for consumers, such as digital cameras, mobile phone cameras, and portable camcorders.

SUMMARY

Embodiments are directed to an image sensor. The image sensor may include a substrate having a plurality of first pixel regions configured to generate image information and a plurality of second pixel regions configured to detect phase information. The image sensor may include a grid pattern on the substrate and dividing a plurality of spaces corresponding to each of the plurality of first pixel regions and the plurality of second pixel regions. The image sensor may include a plurality of color filters respectively in first spaces of the plurality of spaces, excluding second spaces corresponding to the plurality of second pixel regions. The image sensor may include a plurality of polarization patterns respectively in the second spaces and partitioning the second spaces, and a microlens layer including a plurality of first microlenses respectively on the plurality of color filters, a plurality of second microlenses covering the plurality of second pixel regions on a level the same as a level of the plurality of first microlenses, and a charging portion extending from the plurality of second microlenses to the second spaces.

Embodiments are also directed to an image sensor. The image sensor may include a substrate including a plurality of first pixel regions configured to generate image information, a plurality of second pixel regions configured to detect phase information, and an unevenness portion in regions corresponding to upper surfaces of the plurality of second pixel regions. The image sensor may include an insulating layer filling the unevenness portion and covering the upper surface of the plurality of second pixel regions, a grid pattern on the insulating layer and dividing a plurality of spaces corresponding to each of the plurality of first pixel regions and the plurality of second pixel regions, and a plurality of color filters respectively in the plurality of spaces. The image sensor may include a microlens layer including a plurality of first microlenses on the plurality of first pixel regions, among the plurality of color filters, respectively, and a plurality of second microlenses to cover the plurality of second pixel regions on a level the same as a level of the plurality of first microlenses.

Embodiments are also directed to an image sensor. The image sensor may include a substrate including a plurality of first pixel regions configured to generate image information, a plurality of second pixel regions configured to detect phase information, and an unevenness portion in regions corresponding to upper surfaces of the plurality of second pixel regions. The image sensor may include an insulating layer filling the unevenness portion and covering the upper surface of the plurality of second pixel regions, a grid pattern on the insulating layer and dividing a plurality of spaces corresponding to each of the plurality of first pixel regions and the plurality of second pixel regions, and a plurality of color filters respectively in the plurality of spaces. The image sensor may include a plurality of polarization patterns on the insulating layer and partitioning spaces respectively corresponding to the plurality of second pixel regions, among the plurality of spaces and a microlens layer including a plurality of first microlenses on the plurality of first pixel regions, among the plurality of color filters, respectively, and a plurality of second microlenses to cover the plurality of second pixel regions on a level the same as a level of the plurality of first microlenses

BRIEF DESCRIPTION OF DRAWINGS

Features will become apparent to those of skill in the art by describing in detail exemplary embodiments with reference to the attached drawings in which.

DETAILED DESCRIPTION

Figure 1:
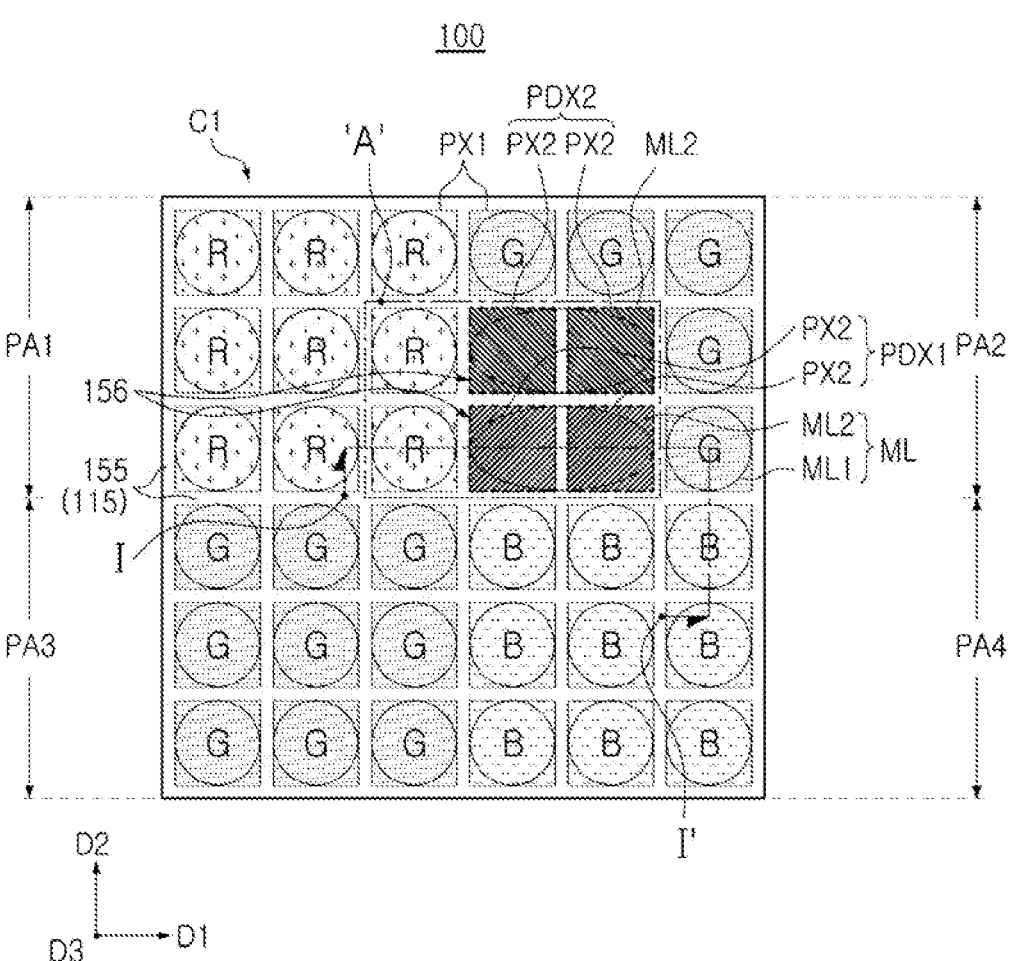
FIG. 1 is a plan view illustrating an image sensor according to an example embodiment.
Figure 2:
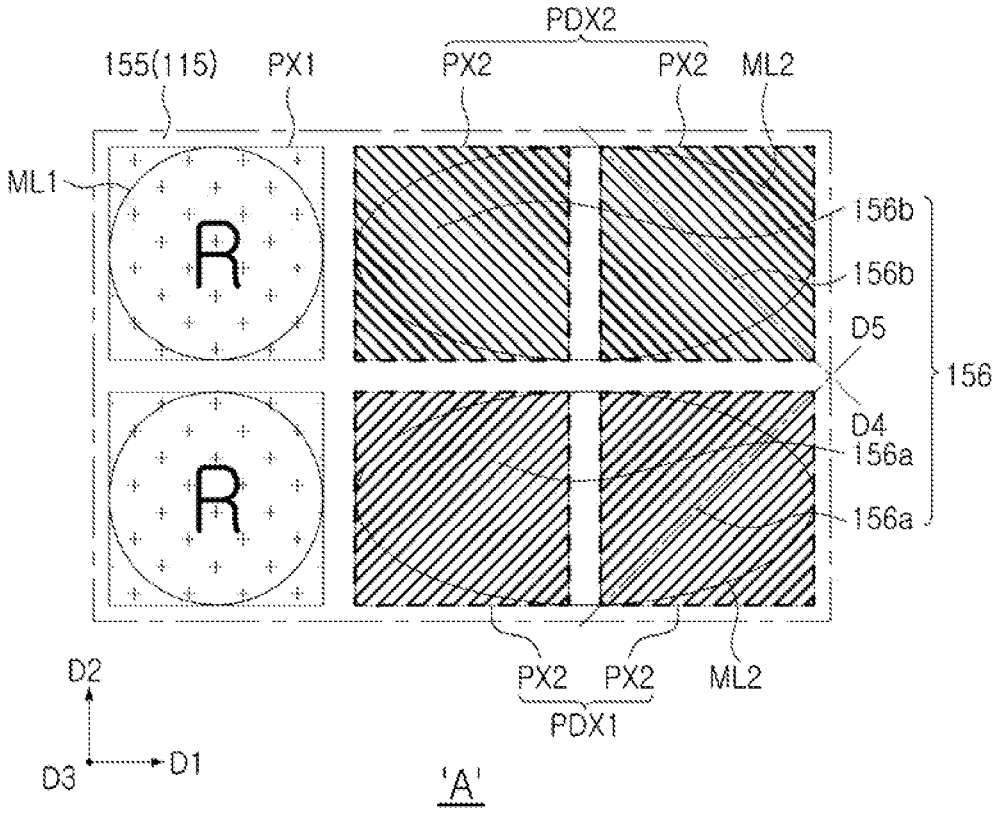
FIG. 2 is an enlarged view of region A of FIG. 1.
Figure 3:
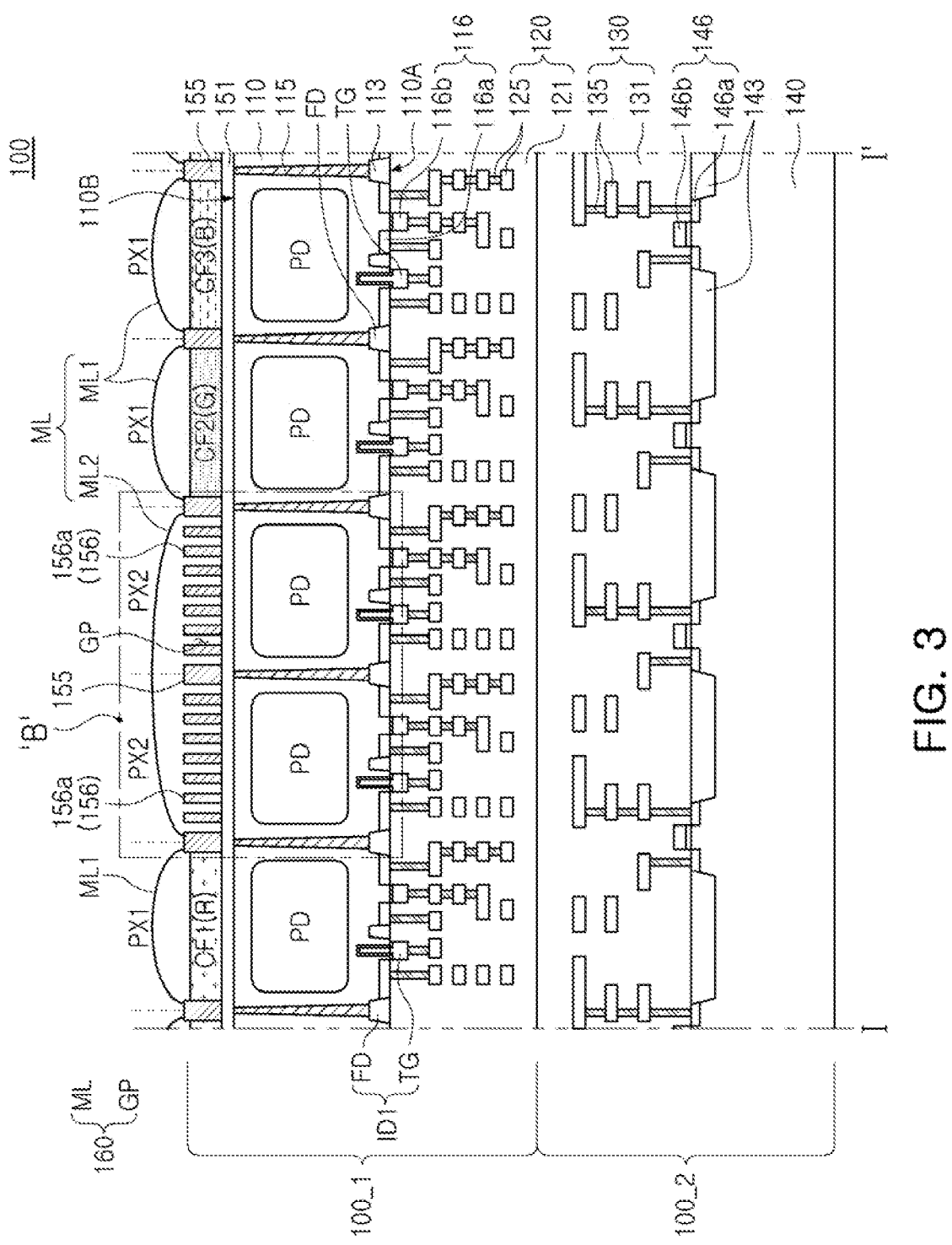
FIG. 3 is a cross-sectional view of the image sensor of FIG. 1, taken along line I-I'.
Figure 4:
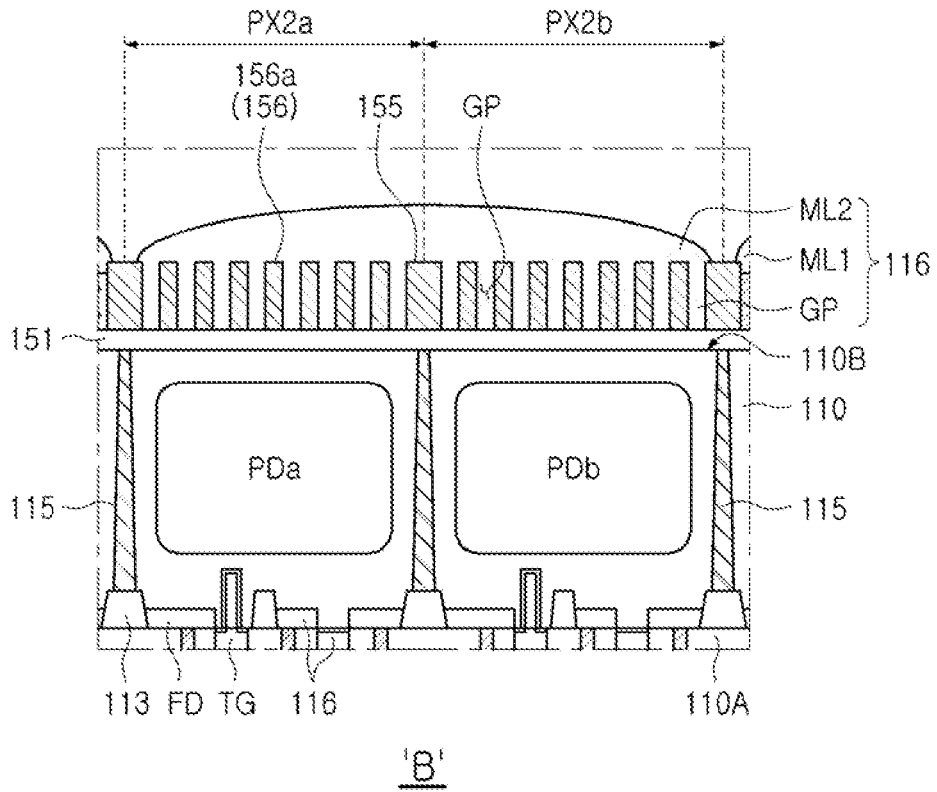
FIG. 4 is an enlarged view of region B of FIG. 3.

FIG. 1 is a plan view illustrating an image sensor according to an example embodiment, and FIG. 2 is an enlarged view of region A of FIG. 1. FIG. 3 is a cross-sectional view of the image sensor of FIG. 1, taken along line I-I', and FIG. 4 is an enlarged view of region B of FIG. 3.

Referring to FIGS. 1 and 3, an image sensor 100 according to the present embodiment may include a second chip 100_2 and a first chip 100_1 on the second chip 100_2. The first chip 100_1 may include a first substrate 110 including a plurality of pixel regions PX1 and PX2 along a plurality of rows and a plurality of columns.

The plurality of pixel regions PX1 and PX2 may include a plurality of first pixel regions PX1 configured to generate image information and second pixel regions PX2 configured to detect phase information. The first pixel regions PX1 are also referred to as "image sensing pixels," and the second pixel regions PX2 are pixels for an autofocusing function and are referred to as "phase detection pixels." In the present embodiment, a case in which a cell C1 including the plurality of pixel regions PX1 and PX2 in six rows and six columns is provided in plural is described as an example. For convenience of description, only one cell C1 is illustrated in FIG. 1. In addition, a case in which each of the plurality of pixel regions PX1 and PX2 includes first to fourth pixel arrays PA1, PA2, PA3, and PA4 each having 3 rows and 3 columns will be described as an example.

In the present embodiment, each of the plurality of second pixel regions PX2 may include a plurality of pairs (e.g., two pairs) of second pixel regions PX2 arranged adjacent to each other. Referring to FIG. 1, the second pixel regions PX2 employed in the present embodiment include a pair of first phase detection pixels PDX1 arranged to be adjacent in a first direction (e.g., D1) and another pair of second phase detection pixel regions PDX2 adjacent to the pair of first phase detection pixels PDX1 and arranged in the first direction D1. In an example, the first phase detection pixels PDX1 and the second phase detection pixel regions PDX2 may be adjacent to each other. In another example, the first phase detection pixels PDX1 and the second phase detection pixel regions PDX2 may be spaced apart from each other.

In the present embodiment, a first microlenses ML1 for the first pixel regions PX1 may be arranged so that one microlens may be located in each pixel, whereas the second microlenses ML2 for the second pixel regions PX2 may be arranged to cover a pair of adjacent pixels. As such, the second microlenses ML2 may have the same width as that of the first microlens ML1 in a second direction but may have a width twice that of the first microlens ML1 in the first direction.

Referring to FIG. 3, the image sensor 100 may include a first chip 100_1 and a second chip 1002 as described above. The first chip 100_1 may be an image sensor chip in which a plurality of pixel regions PX1 and PX2 are arranged, and the second chip 100_2 may be a logic semiconductor chip. In this specification, only the first chip 100_1 may be referred to as an image sensor in a narrow sense.

In the present embodiment, the second chip 100_2 may include a second substrate 140 and a second wiring structure 130 on the second substrate 140. In an implementation, the second substrate 140 may include a group IV semiconductor, such as Si or Ge, a group IV-IV compound semiconductor, such as SiGe or SiC, or a group III-V compound semiconductor, such as GaAs, InAs, or InP. The second substrate 140 may include an element isolator 143 defining an active region and second individual elements 146 on the active region, and the second individual elements 146 may constitute a logic circuit for image processing and may be, i.e., a transistor element having impurity regions 146a provided as a source/drain and a gate structure 146b. The second wiring structure 130 may include a second insulating layer 131 and a second multilayer wiring 135 in the second insulating layer 131 and connected to the second individual elements 146. The second multilayer wiring 135 may include a plurality of wiring layers located on different height levels and vias electrically connecting the plurality of wiring layers and/or the second individual elements 146.

The first chip 100_1 may include the first substrate 110 having first and second surfaces 110A and 110B opposing each other and a first wiring structure 120 on the first surface 110A of the first substrate 110. The first substrate 110 may include a device isolation pattern 115 defining pixel regions provided to each of the pixels PX1 and PX2 and photoelectric conversion devices 150a in each pixel region. In an implementation, the photoelectric conversion devices 150a may generate and accumulate charges in proportion to the amount of light incident from the second surface 110B of the substrate. The first photoelectric conversion devices PD may be inside the first substrate 110. In an implementation, the photoelectric conversion device PD may be implemented as a phototransistor, a photo gate, a pinned photo diode PPD, or combinations thereof, in addition to a photo diode.

The first substrate 110 may include a device isolation region 113 on the first surface 110A and defining an active region together with the photoelectric conversion device PD, a transfer gate TG and a floating diffusion region FD on the active region, and first individual devices 116 on the active region. The transfer gate TG may have a vertical transistor gate structure extending from a surface of the active region of the first substrate 110, that is, the first surface 110A, to the inside of the first substrate 110. The floating diffusion region FD may be in the active region adjacent to the transfer gate TG. The first individual devices 116 may include a transistor having impurity regions 116a serving as a source/drain and a gate structure 116b. The transistor may include a reset transistor, a selection transistor, and a source follower transistor. The first wiring structure 120 may include a first insulating layer 121 and a first multilayer wiring 125 in the first insulating layer 121 and connected to the first individual elements 116. The first multilayer wiring 125 may include a plurality of wiring layers located on different height levels and vias electrically connecting the plurality of wiring layers and/or the first individual elements 116.

The image sensor 100 according to the present embodiment may include an insulating layer 151, a grid pattern 155, a polarization pattern 156, color filters CF1, CF2, and CF3, and a microlens layer 160 sequentially on the second surface 110B of the substrate 110. The insulating layer 151 may cover the second surface 110B of the first substrate 110 between the second surface 110B of the first substrate 110 between the color filters CF1, CF2, and CF3. The insulating layer 151 may include an anti-reflection layer. In some embodiments, the insulating layer 151 may additionally include a planarization layer. In an implementation, the insulating layer 151 may include, e.g., aluminum oxide, hafnium oxide, silicon oxide, or silicon nitride. As used herein, the term "or" is not an exclusive term, e.g., "A or B" would include A, B, or A and B.

The grid pattern 155 may be on the insulating layer 151 to define the pixel regions PX1 and PX2. The grid pattern 155 may define first spaces for arranging the color filters CF1, CF2, and CF3. Also, the grid pattern 155 may provide a second space corresponding to the second pixel region PX2 for phase detection. In the present embodiment, the second space may correspond to two adjacent pixel regions PX2 as described above. The grid pattern 155 may vertically overlap the device isolation pattern 115. The grid pattern 155 may not vertically overlap the photoelectric conversion device PD in the pixel regions PX1 and PX2. In an implementation, the grid pattern 155 may include a metal, such as tungsten. In addition, the grid pattern 155 may include a high refractive index material, such as $TiO_2$, a low refractive index material, tetraethoxysilane (TEOS), or may be an air gap.

Referring to FIGS. 2 and 3, the polarization pattern 156 may be only in the second space corresponding to the second pixel region PX2 for phase detection. The polarization pattern 156 may be on the insulating layer 151 and may extend from the grid pattern 155. The polarization pattern 156 may be the same material as that of the grid pattern 155, and may be a different material from that of the grid pattern 155. In an implementation, the polarization pattern 156 may include a metal, such as tungsten. In addition, the polarization pattern 156 may include a high refractive index material, such as $TiO_2$, a low refractive index material, tetraethoxysilane (TEOS), or may be an air gap. The polarization pattern 156 may have a height on substantially the same level as that of the grid pattern 155, but according to embodiments, the polarization pattern 156 may have a height on a level lower than that of the grid pattern 155. In an implementation, when the polarization pattern 156 and the grid pattern 155 are the same material in the same process, the polarization pattern 156 may have a height on substantially the same level as that of the grid pattern 155. Meanwhile, when the polarization pattern 156 and the grid pattern 155 are in different processes, the polarization pattern 156 may have a height on a different level from that of the grid pattern 155.

Referring to FIG. 3, the polarization pattern 156 may include a plurality of linear patterns to reduce diffuse reflection occurring in the second pixel region PX2. The plurality of linear patterns may be arranged to cover the second space. The plurality of linear patterns may be spaced apart from each other at equal intervals in one direction, and may be parallel to each other in one direction. The polarization pattern 156 may have different directivity for each of the phase detection pixels PDX1 and PDX2. In an implementation, as illustrated in FIG. 2, a first polarization pattern 156a of the first phase detection pixels PDX1 may be in a fourth direction D4, and a second polarization pattern 156b of the second phase detection pixels PDX2 may be in a fifth direction D5 orthogonal to the fourth direction D4. The plurality of linear patterns may be arranged to have the same width and spacing. In an implementation, each of the plurality of linear patterns may have a width of about 20 nm to about 300 nm, and may be arranged to have a spacing of about 20 nm to about 300 nm from each other. In an implementation, each of the plurality of linear patterns may have a width of about 20 nm to about 150 nm, and may be arranged to have a spacing of about 20 nm to about 150 nm from each other. Also, the width of the plurality of linear patterns may be half of the width of the grid pattern 155.

The color filters CF1, CF2, and CF3 may be in first spaces defined by the grid pattern 155 to provide the first pixel regions PX1 for image sensing. The color filters CF1, CF2, and CF3 may include a blue (B) color filter CF1, a green (G) color filter CF2, and a red (R) color filter CF3. In the present embodiment, the color filters CF1, CF2, and CF3 may vertically overlap the photoelectric conversion device PD in the pixel regions PX, respectively. Each of the color filters CF1, CF2, and CF3 may allow light having a different specific wavelength to transmit therethrough, and the photoelectric conversion device PD located therebelow may generate charge from light having a specific wavelength. As illustrated in FIG. 1, the color filters CF1, CF2, and CF3 may be arranged in a nona-type pattern of 6 rows and 6 columns. In the nona-type pattern, the green filters CF2 with which the human eye reacts most sensitively may be arranged to be half of all color filters.

The microlens layer 160 may include a charging portion GP filling the second space located on the second pixel region PX2 and microlenses ML1 and ML2 respectively on the color filters CF1, CF2, and CF3 and the charging portion GP. The microlenses ML may have a convex shape (e.g., a hemispherical shape) and may have a predetermined radius of curvature. The microlenses ML may condense light by changing a path of light incident on the image sensor.

The microlenses may be arranged to corresponding to the first and second pixel regions PX1 and PX2, respectively. The microlenses ML may include a plurality of first microlenses ML1 respectively on the color filters CF1, CF2, and CF3 and a second microlens ML2 to cover the second pixel regions PX2 on the same level as that of the plurality of first microlenses ML1. As described above, in the present embodiment, the first microlenses ML1 may be arranged in the first pixel regions PX1, respectively, and the second microlenses ML2 may be arranged to cover a pair of second pixel regions PX2 adjacent to each other.

The charging portion GP employed in the present embodiment may have a structure integrated with the plurality of microlenses ML. The charging portion GP and the microlenses ML may be formed through the same process (refer to FIGS. 4D and 4E). The charging portion GP may be located on a lower surface of the second microlens ML2. The charging portion GP may be continuously formed without an interface with the second microlens ML2. The charging portion GP may be the same light-transmitting material as that of the first and second microlenses ML1 and ML2. In an implementation, the microlens layer 160 may include a transparent material having a light transmittance of 90% or more for light of all visible light bands. In an implementation, the microlens layer 160 may include a transparent resin.

The second pixel region PX2 may have the charging portion GP by applying a transparent material for the second microlens ML2 in place of the color filters CF1, CF2, and CF3. Since the charging portion GP is the same transparent material as that of the microlenses ML1 and ML2 through the same process, the second microlens ML2 and the charging portion GP may be continuously without an interface to have an integrated structure.

As such, since the transparent charging portion GP may be integrated with the microlens ML without introducing a color filter in the second pixel region PX2 for phase detection, light loss due to the color filter may be prevented. In addition, since the charging portion GP does not have a physical/optical interface with the microlens ML, light loss, such as reflection, occurring at the interface may be prevented, thereby significantly improving light reception capability of the phase detection pixels.

As illustrated in FIGS. 2 and 3, the phase detection pixels PDX1 and PDX2 employed in the present embodiment may include the single second microlens ML2 configured to be shared by a pair of phase detection pixels PX2a and PX2b. The second microlens ML2 shared by the phase detection pixels PX2a and PX2b may control light incident to the photoelectric conversion devices PDa and PDb using a lens shape and/or refractive index. By the second microlens ML2, the phase detection pixels PX2a and PX2b may output different phase signals and may adjust the focus by the different phase signals.

Figure 5A:
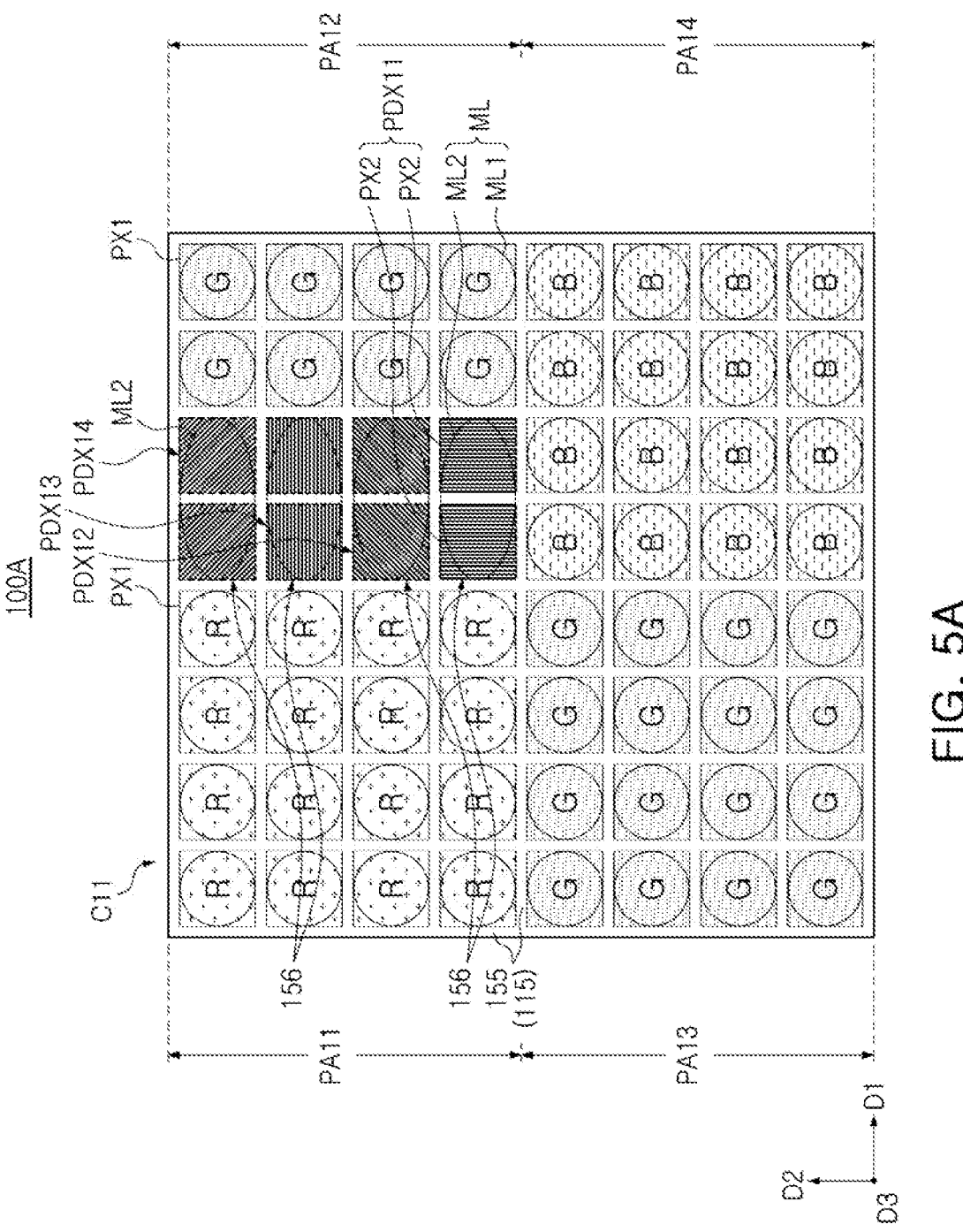
FIGS. 5A to 5C are modified examples of the image sensor of FIG. 1.
Figure 5B:
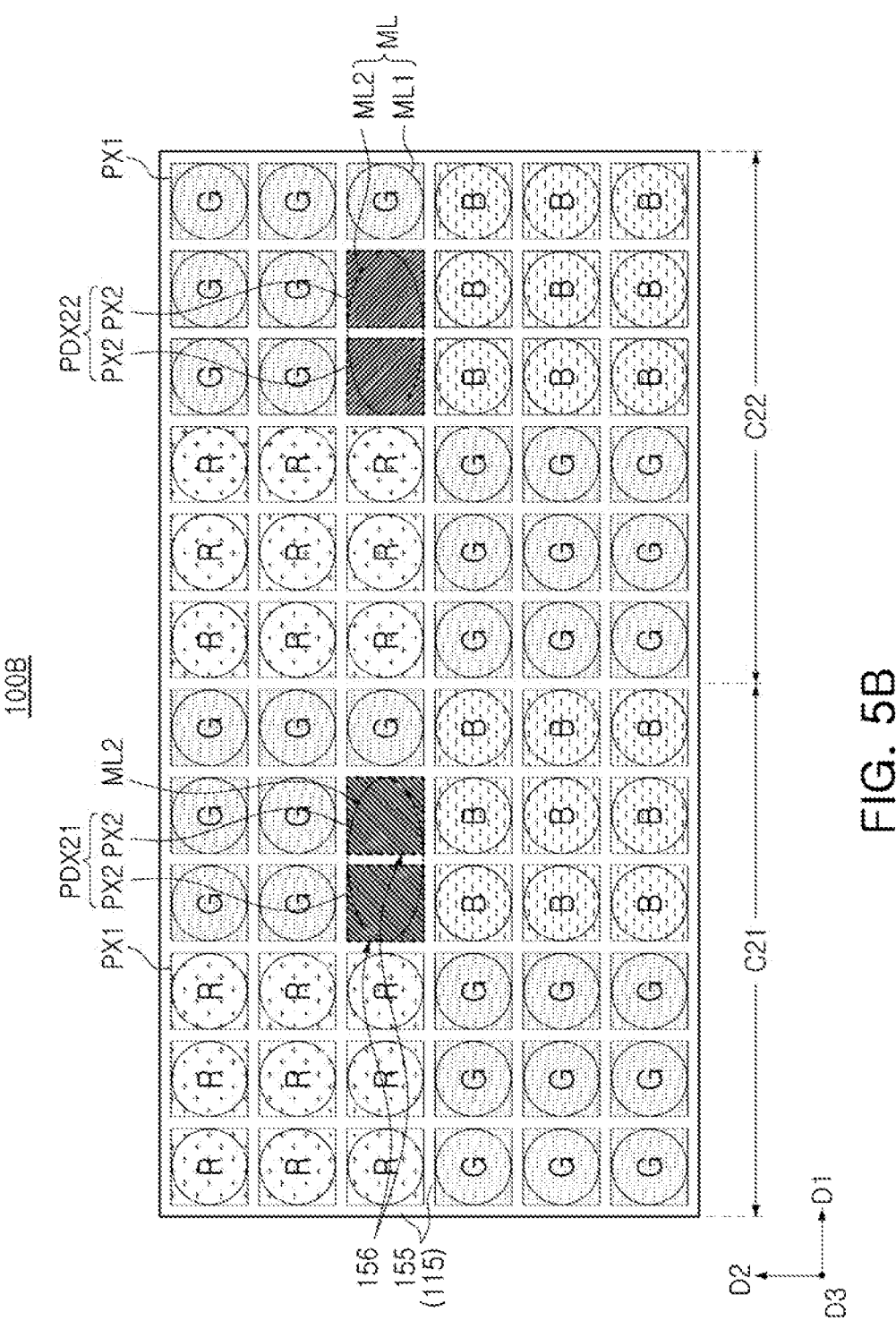
Figure 5C:
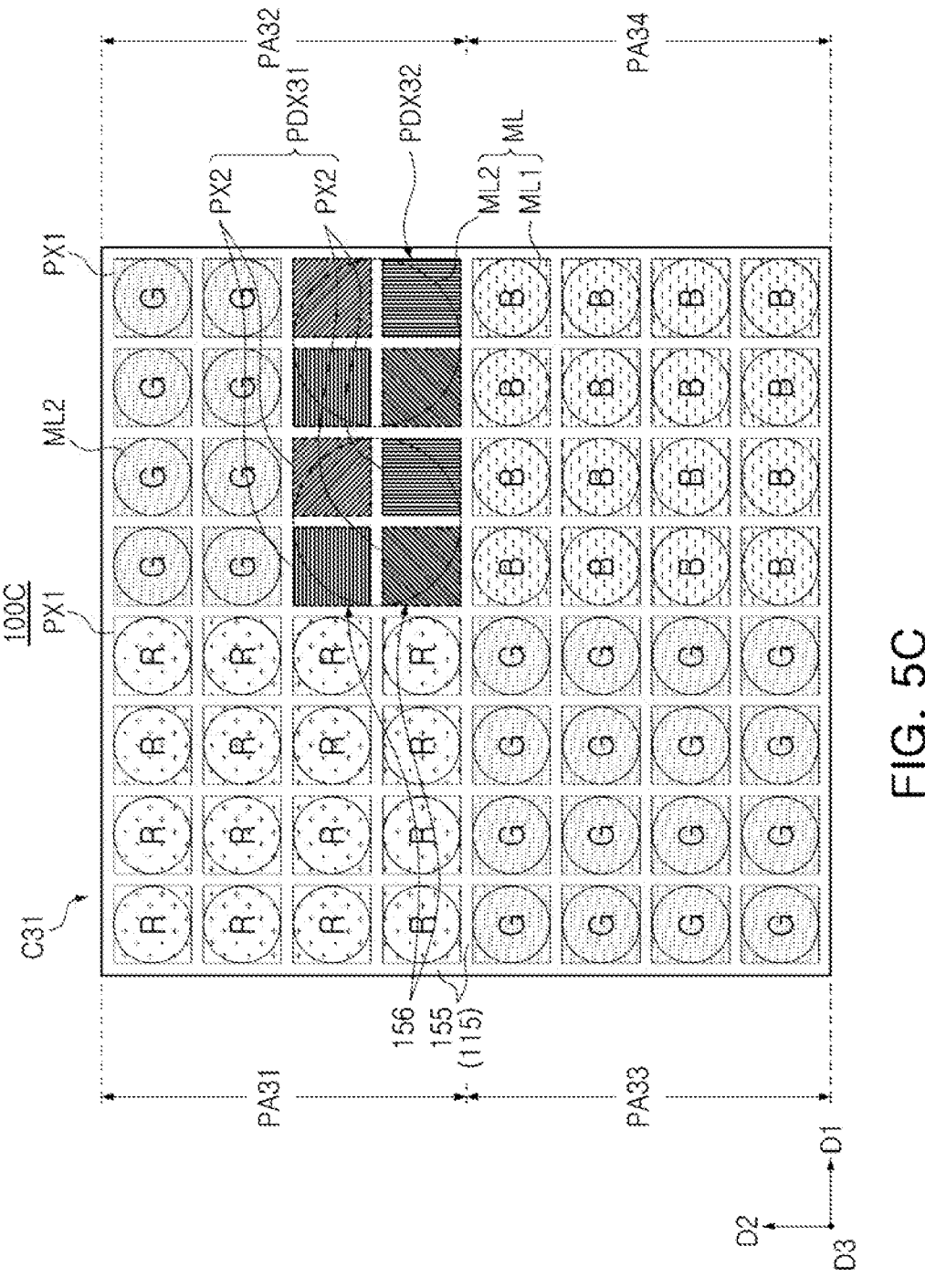

FIGS. 5A to 5C are modified examples of the image sensor of FIG. 1. FIG. 5A is a plan view illustrating an image sensor 100A according to an example embodiment. Referring to FIG. 5A, the present embodiment will be described by a case in which a cell C11 including the plurality of pixel regions PX1 and PX2 in 8 rows and 8 columns are provided in plural, as an example. For convenience of description, only one cell C11 is illustrated in FIG. 5A. In addition, a case in which each of the plurality of pixel regions PX1 and PX2 includes first to fourth pixel arrays PA11, PA12, PA13, and PA14 each having 4 rows and 4 columns will be described as an example. Also, an image sensor 100A according to the present embodiment may include first to fourth phase detection pixel regions PDX11, PDX12, PDX13, and PDX14. Except for this, the present embodiment may be understood as being similar to the image sensor 100 illustrated in FIGS. 1 to 4. In addition, each component of the image sensor 100A according to the present embodiment may be understood by referring to descriptions of the same or similar components as those of the image sensor 100 described above with reference to FIGS. 1 to 4 unless otherwise stated.

The first to fourth phase detection pixel regions PDX11, PDX12, PDX13, and PDX14 may include polarization patterns 156 having different directivities. In an implementation, the polarization patterns of the first to fourth phase detection pixel regions PDX11, PDX12, PDX13, and PDX14 may be in a direction having an included angle of 45 degrees with the polarization patterns of the adjacent phase detection pixel regions, respectively.

FIG. 5B is a plan view illustrating an image sensor 100B according to an embodiment. Referring to FIG. 5B, the present embodiment will be described by a case in which a pair of cells C21 and C22 including a plurality of pixel regions PX1 and PX2 having three rows and three columns are included in plural, as an example. For convenience of description, only a pair of cells C21 and C22 are illustrated in FIG. 5B. Except for this, the present embodiment may be understood as being similar to the image sensor 100 illustrated in FIGS. 1 to 4. In addition, each component of the image sensor 100A according to the present embodiment may refer to the descriptions of the same or similar components as those of the image sensor 100 described above with reference to FIGS. 1 to 4 unless otherwise stated.

The first and second phase detection pixel regions PDX21 and PDX22 may be arranged in different cells, respectively. In an implementation, the first phase detection pixel regions PDX21 may be in the first cell C21 and the second phase detection pixel regions PDX21 may be in the second cell C22. The first and second phase detection pixel regions PDX21 and PDX22 may be arranged in positions corresponding to each other in the first and second cells C21 and C22.

FIG. 5C is a plan view illustrating an image sensor 100C according to an example embodiment. Referring to FIG. 5C, the present embodiment will be described by a case in which a cell C31 may include a plurality of pixel regions PX1 and PX2 in 8 rows and 8 columns, as an example. For convenience of description, only one cell C31 is illustrated in FIG. 5C. In addition, a case in which each of the plurality of pixel regions PX1 and PX2 includes first to fourth pixel arrays PA31, PA32, PA33, and PA34 in 4 rows and 4 columns will be described as an example. Also, the image sensor 100C according to the present embodiment may include first and second phase detection pixel regions PDX31 and PDX32. Each of the first and second phase detection pixel regions PDX31 and PDX32 may include a second microlens ML2 to cover the four second pixel regions PX2 arranged in a square shape.

Except for this, the present embodiment may be understood as being similar to the image sensor 100 illustrated in FIGS. 1 to 4. In addition, each component of the image sensor 100C according to the present embodiment may refer to the descriptions of the same or similar components as those of the image sensor 100 described above with reference to FIGS. 1 to 4 unless otherwise stated.

The fourth pixel regions PX2 respectively included in the first and second phase detection pixel regions PDX31 and PDX32 may include polarization patterns 156 having different directivities. In an implementation, four polarization patterns included in the first and second phase detection pixel regions PDX31 and PDX32 may be in a direction having an included angle of 45 degrees with the polarization patterns of adjacent phase detection pixel regions.

Figure 6:
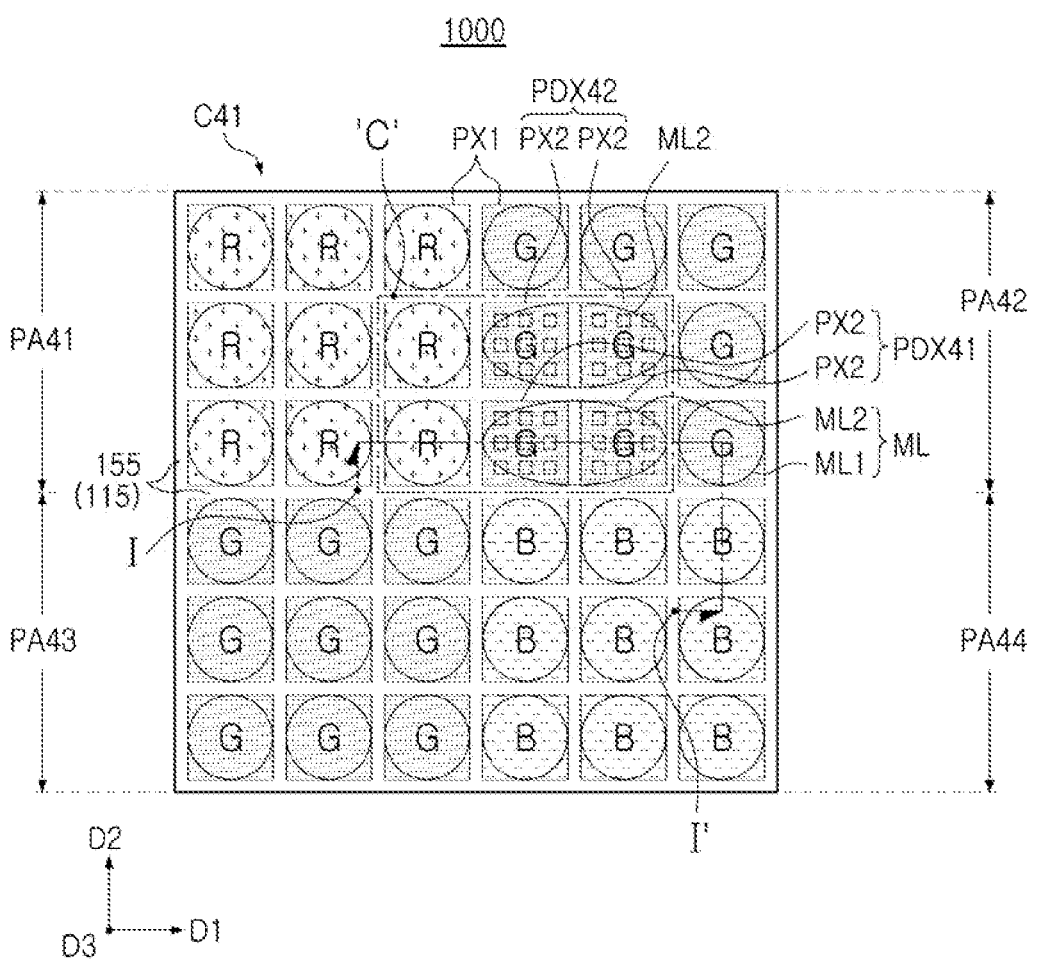
FIG. 6 is a plan view illustrating an image sensor according to an example embodiment.
Figure 7:
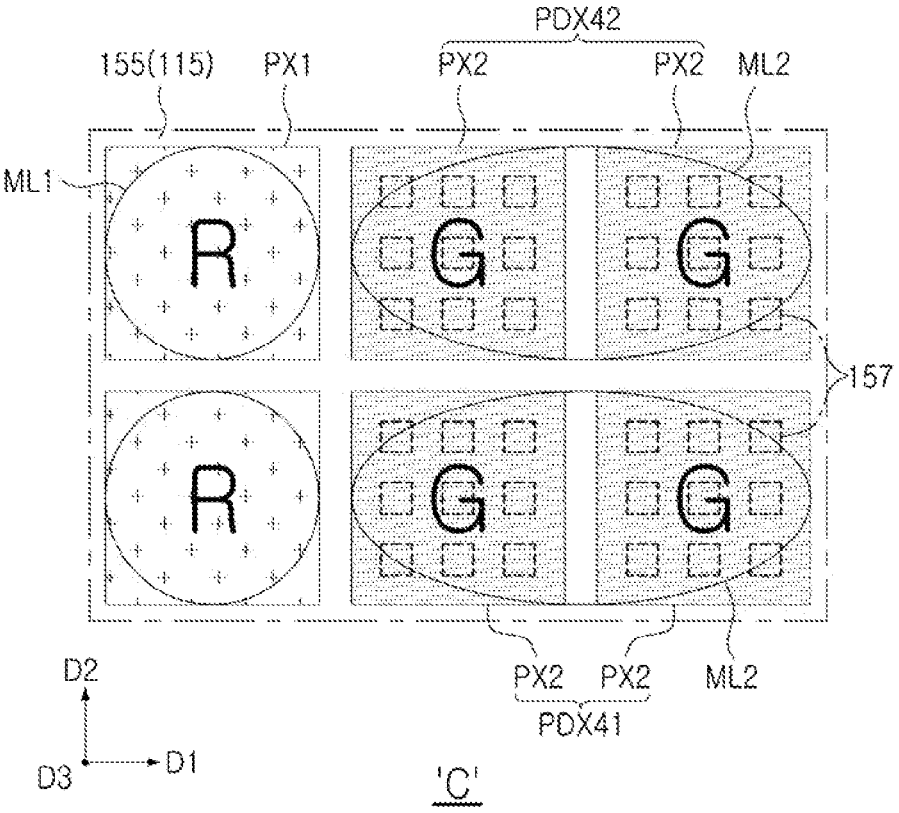
FIG. 7 is an enlarged view of region C of FIG. 6.
Figure 8:
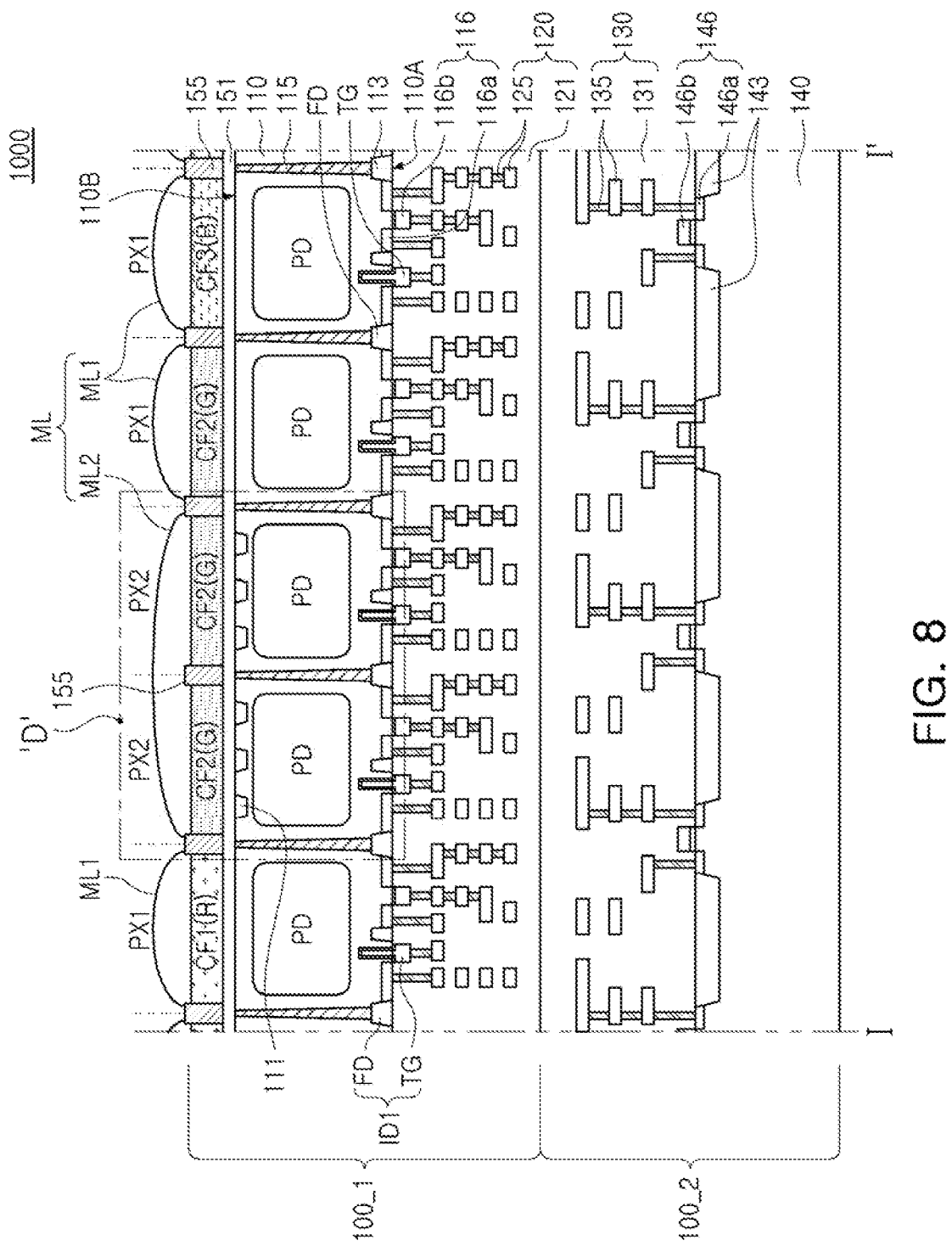
FIG. 8 is a cross-sectional view of the image sensor of FIG. 6, taken along line I-I'.
Figure 9:
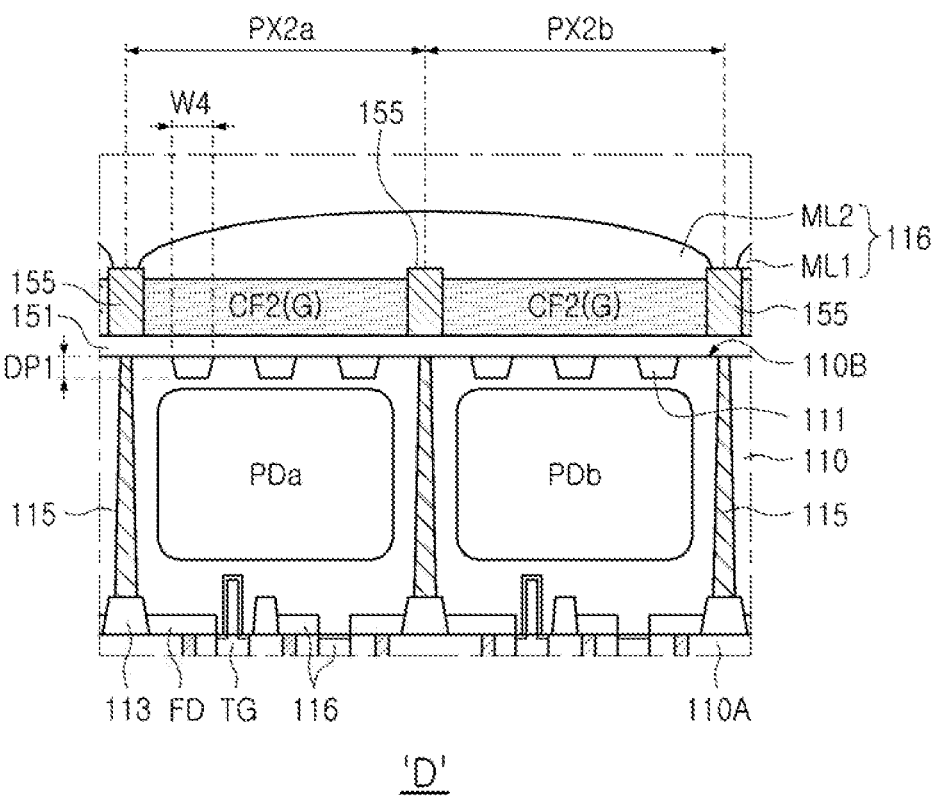
FIG. 9 is an enlarged view of region D of FIG. 8.

FIG. 6 is a plan view illustrating an image sensor according to an embodiment, and FIG. 7 is an enlarged view of region C of FIG. 6. FIG. 8 is a cross-sectional view of the image sensor of FIG. 6, taken along line I-I', and FIG. 9 is an enlarged view of region D of FIG. 8.

Referring to FIGS. 6 and 7, in an image sensor 1000 according to the present embodiment, an unevenness portion 157 may be in the second pixel region PX2 for phase detection. In addition, a case in which each of the plurality of pixel regions PX1 and PX2 may include first to fourth pixel arrays PA41, PA42, PA43, and PA44 each having 3 rows and 3 columns will be described as an example. Also, the image sensor 100A according to the present embodiment may include first and second phase detection pixel regions PDX41 and PDX42. In addition, the image sensor 1000 of the present embodiment may be different from the image sensor 100 illustrated in FIGS. 1 to 4, in that a polarization pattern is not disposed. Except for this, the present embodiment may be understood as being similar to the image sensor 100 illustrated in FIGS. 1 to 4. In addition, each component of the image sensor 1000 according to the present embodiment may refer to descriptions of the same or similar components as those of the image sensor 100 described in FIGS. 1 to 4 unless otherwise stated.

Referring to FIGS. 6 to 9, the image sensor 1000 according to the present embodiment may include the unevenness portion 157 on the second surface 110B of the substrate 110, an insulating layer 151 filling the unevenness portion 157, a grid pattern 155, color filters CF1, CF2, and CF3, and a microlens layer 160.

The unevenness portion 157 may include a plurality of concave portions at predetermined intervals on the second surface 110B of the first substrate 110. A width W4 and a depth DP1 of the unevenness portion 157 may be variously modified. The unevenness portion 157 may be on the second surface 110B of the first substrate 110 to a depth DP1 less than 100 nm, i.e., about 500 Å to about 700 Å. In the present embodiment, a case in which the unevenness portion 157 may include a plurality of concave portions spaced apart from each other is described, and the unevenness portion 157 may have various shapes that may increase a surface area of the second surface 110B of the first substrate 110, such as a lattice shape or a quadrangular pyramid shape. The unevenness portion 157 may increase the surface area of the second surface 110B of the first substrate 110 to increase the amount of light received from the photoelectric conversion devices PDa and PDb of the phase detection pixels PDX41 and PDX42. Accordingly, sensitivity of the image sensor 1000 may be improved.

Referring to FIGS. 7 and 9, the phase detection pixels PDX41 and PDX42 of the present embodiment may include a pair of phase detection pixels PX2a and PX2b, respectively. The pair of phase detection pixels PX2a and PX2b may share one second microlens ML2.

The color filters CF1, CF2, and CF3 may be respectively arranged in spaces defined by the grid pattern 155 to provide first pixel regions PX1 and second pixel regions PX1 and PX2. The color filters CF1, CF2, and CF3 may include a blue (B) color filter CF1, a green (G) color filter CF2, and a red (R) color filter CF3. In the present embodiment, each of the color filters CF1, CF2, and CF3 may vertically overlap one photoelectric conversion device PD in one pixel region PX. The green (G) color filter CF2 may be in the second pixel regions PX1 and PX2.

Referring to FIG. 9, insulating layers 111 and 151 may be on an upper surface 110B of the first substrate 110. The insulating layers 111 and 151 may include a first insulating layer 111 filling the unevenness portion 157 and a second insulating layer 151 entirely covering the upper surface 110B of the first substrate 110. The first insulating layer 111 and the second insulating layer 151 may be the same material. In an implementation, the first insulating layer 111 and the second insulating layer 151 may include, e.g., aluminum oxide, hafnium oxide, silicon oxide, or silicon nitride.

Figure 10:
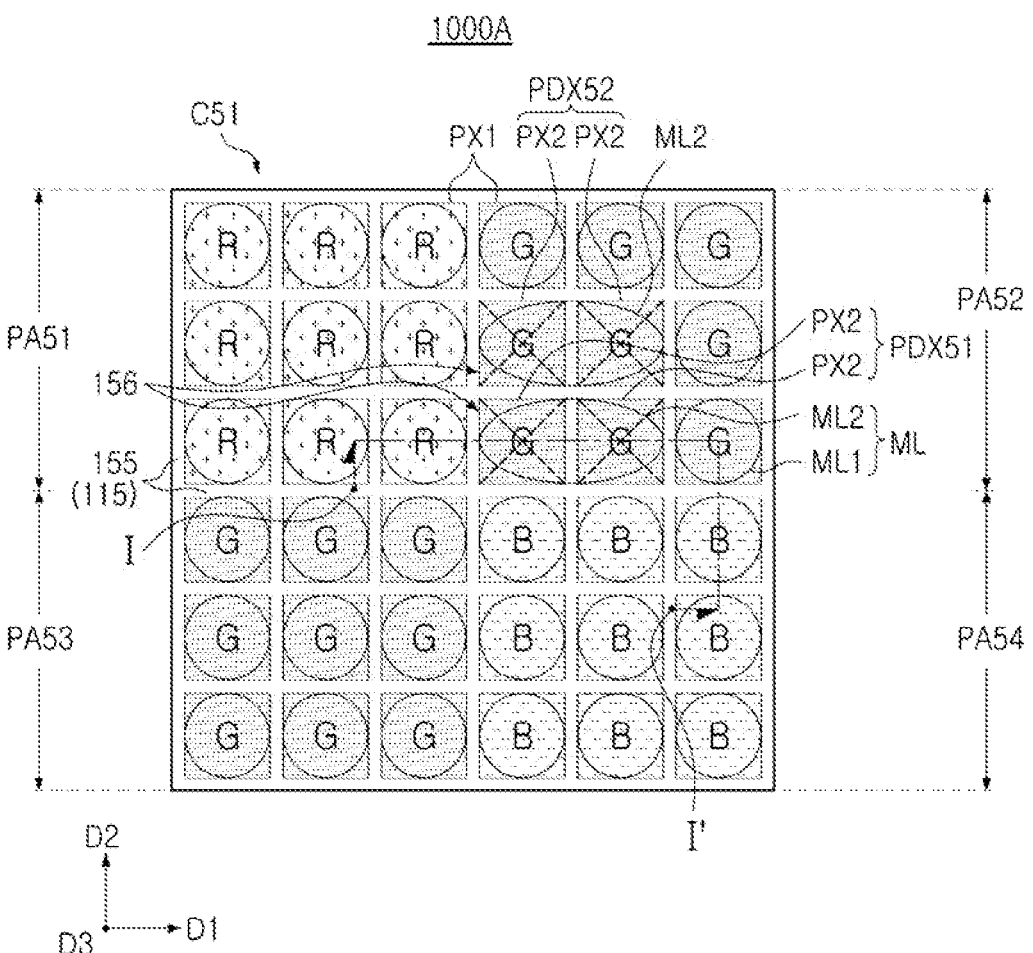
FIG. 10 is a plan view illustrating an image sensor according to an example embodiment.
Figure 11:
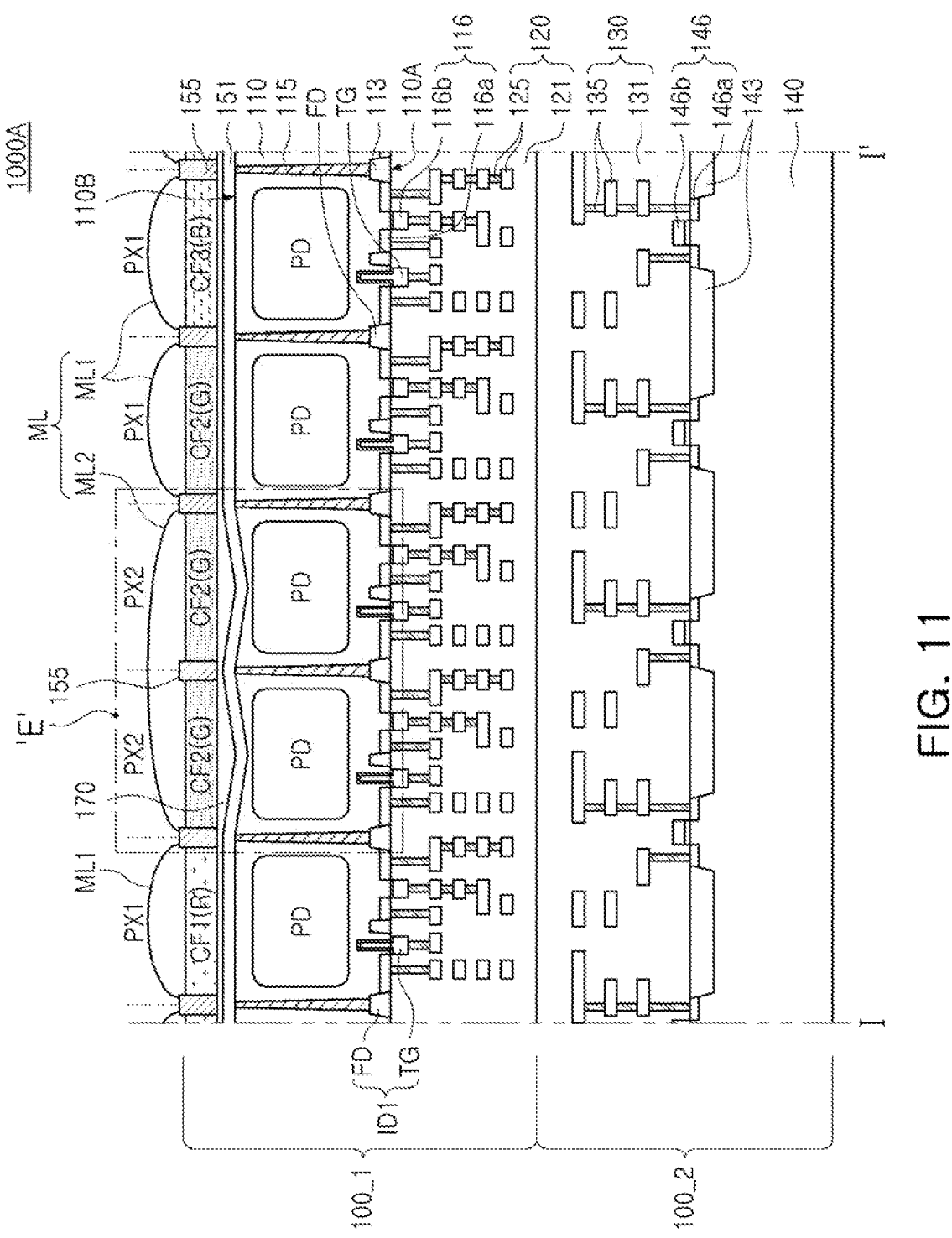
FIG. 11 is a cross-sectional view of the image sensor of FIG. 10, taken along line I-I'.
Figure 12:
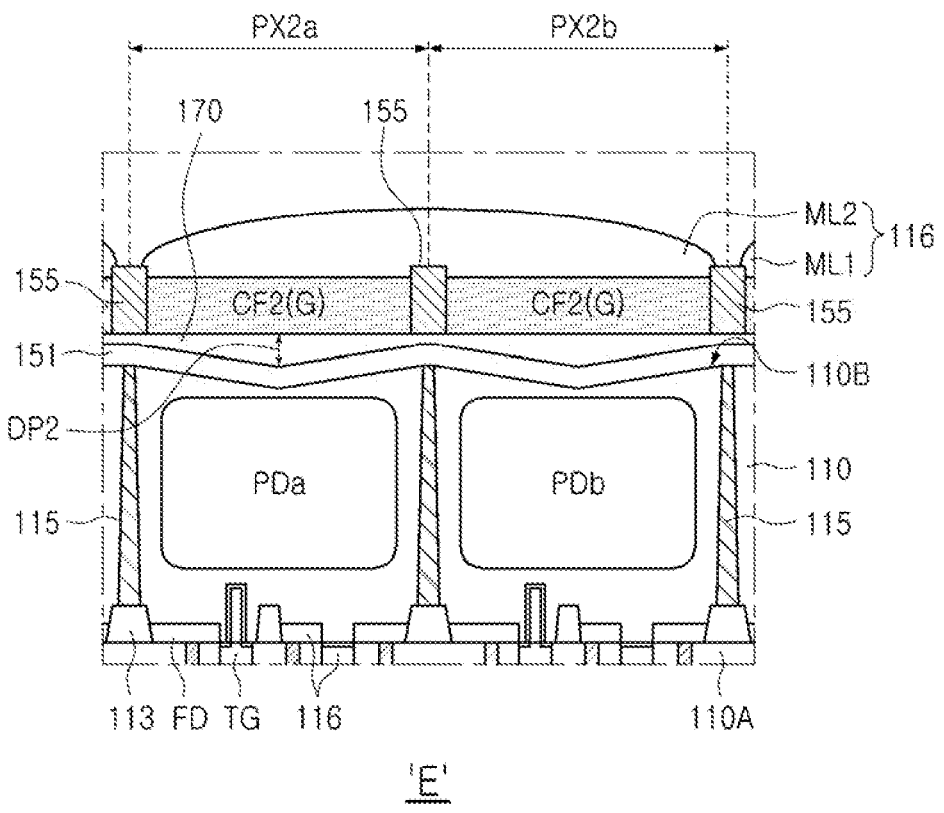
FIG. 12 is an enlarged view of region E of FIG. 11.

FIG. 10 is a plan view illustrating an image sensor according to an embodiment, and FIG. 11 is a cross-sectional view of the image sensor of FIG. 10, taken along line I-I'. FIG. 12 is an enlarged view of region E of FIG. 11. Referring to FIGS. 10 to 12, the image sensor 1000 according to the present embodiment may include an unevenness portion 157 on the second surface 110B of the substrate 110, an insulating layer 151 on the unevenness portion 157, a planarization layer 170, a grid pattern 155, color filters CF1, CF2, and CF3, and a microlens layer 160.

Compared to the image sensor 1000 illustrated in FIGS. 6 to 9 described above, the image sensor 1000A of the present embodiment may include the unevenness portion 157 having a quadrangular pyramid shape and the planarization layer on top of the insulating layer 151. Except for this, the present embodiment may be understood as being similar to the image sensor 1000 illustrated in FIGS. 6 to 9. In addition, each component of the image sensor 1000A according to the present embodiment may refer to descriptions of the same or similar components as those of the image sensor 1000 described above with reference to FIGS. 6 to 9 unless otherwise stated.

Referring to FIGS. 10 to 12, the unevenness portion 157 of the image sensor 1000A of the present embodiment may have a quadrangular pyramid shape. When the upper surface 110B of the first substrate 110 is wet-etched, etching may be performed along a crystal plane in a (111) direction having a high etching rate, so that the unevenness portion 157 having a quadrangular pyramid shape may be formed. The insulating layer 151 may be on the unevenness portion 157 to have a uniform thickness. The planarization layer 170 may be on the insulating layer 151 to planarize a surface of the insulating layer 151. A depth DP2 of the planarization layer 170 may be less than half of the width of the phase detection pixels PX2a and PX2b. In an implementation, when the widths of the phase detection pixels PX2a and PX2b are about 0.6 µm, the depth DP2 of the planarization layer 170 may be about 2500 Å. The planarization layer 170 may include, e.g., aluminum oxide, hafnium oxide, silicon oxide, or silicon nitride.

Figure 13:
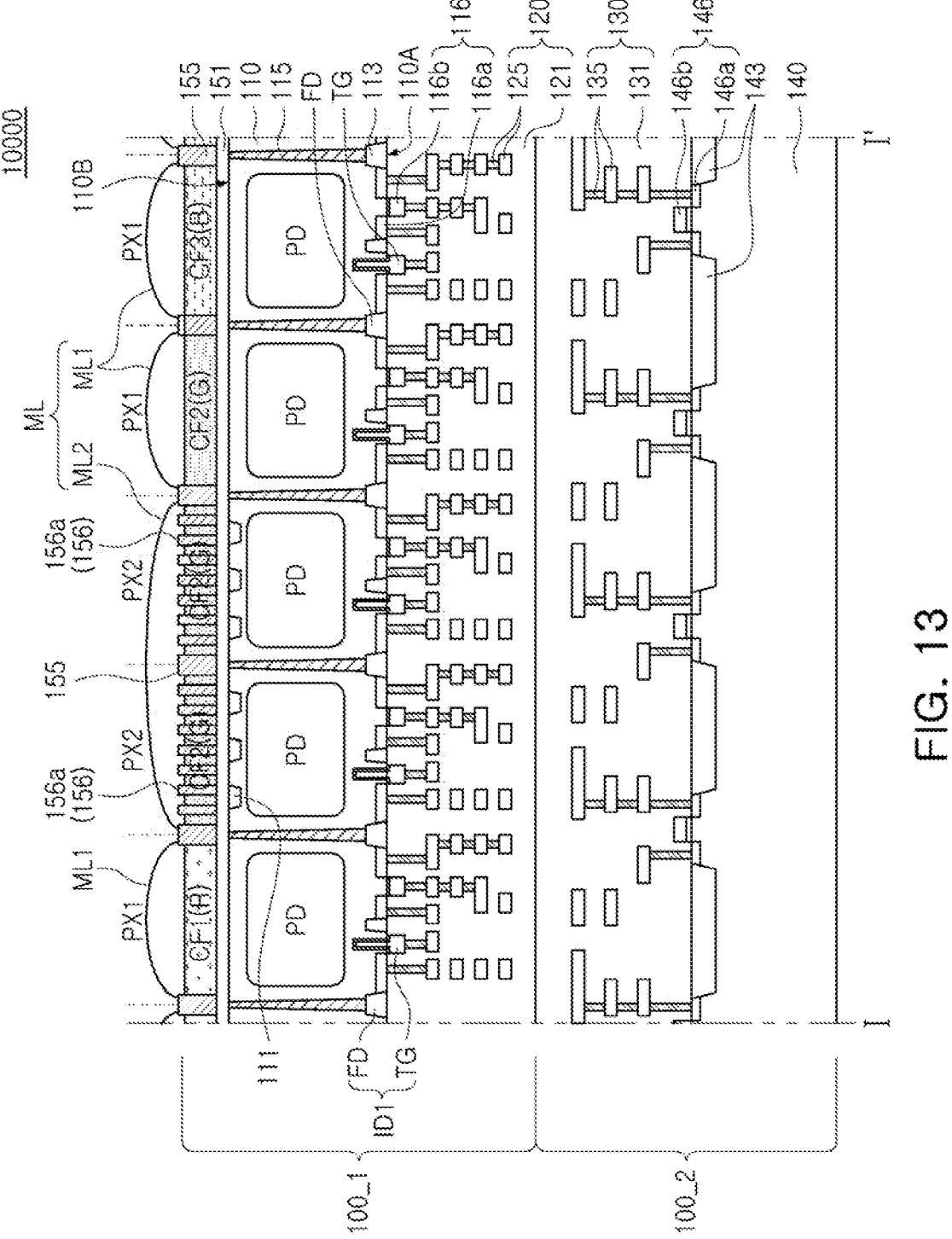
FIG. 13 is a cross-sectional view illustrating an image sensor according to an example embodiment.

FIG. 13 is a cross-sectional view illustrating an image sensor according to an example embodiment. An image sensor 10000 of the present embodiment may include both the polarization pattern 156 included in the image sensor 100 of FIGS. 1 to 4 described above and the unevenness portion 157 included in the image sensor 1000 of FIGS. 6 to 9. Accordingly, sensitivity of the image sensor 10000 may be improved, while diffuse reflection occurring in the second pixel region PX2 may be reduced.

FIGS. 14A to 14F are cross-sectional views illustrating major processes of a manufacturing method of the image sensor of FIG. 13. The manufacturing method according to the present embodiment may be understood as a manufacturing method of the image sensor 10000 illustrated in FIG. 13.

Figure 14A:
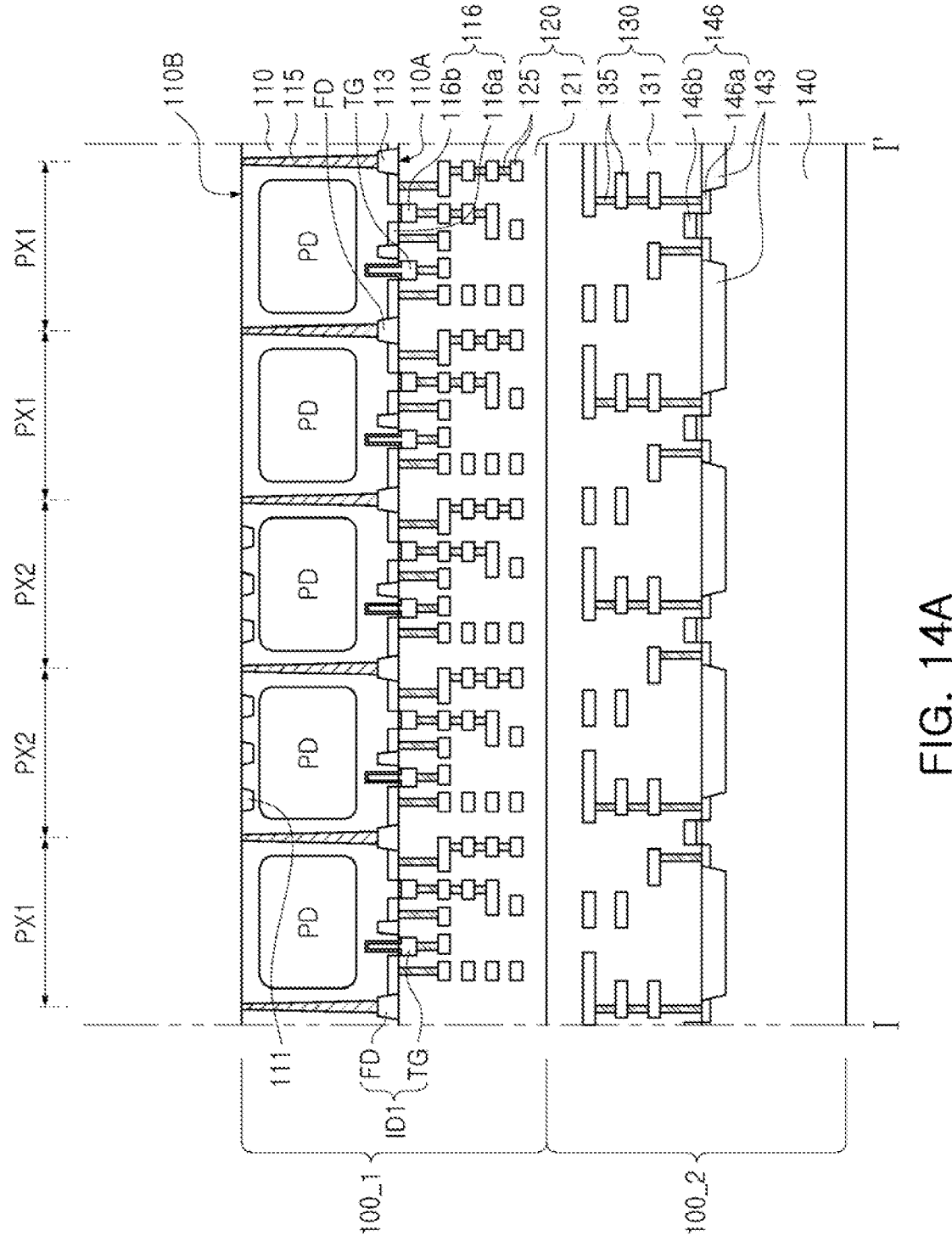
FIGS. 14A to 14F are cross-sectional views illustrating major processes in a manufacturing method of the image sensor of FIG. 13.

First, referring to FIG. 14A, the upper surface 110B of the first substrate 110 may be etched to form an unevenness portion, and then a first insulating layer 111 filling the unevenness portions is formed.

Figure 14B:
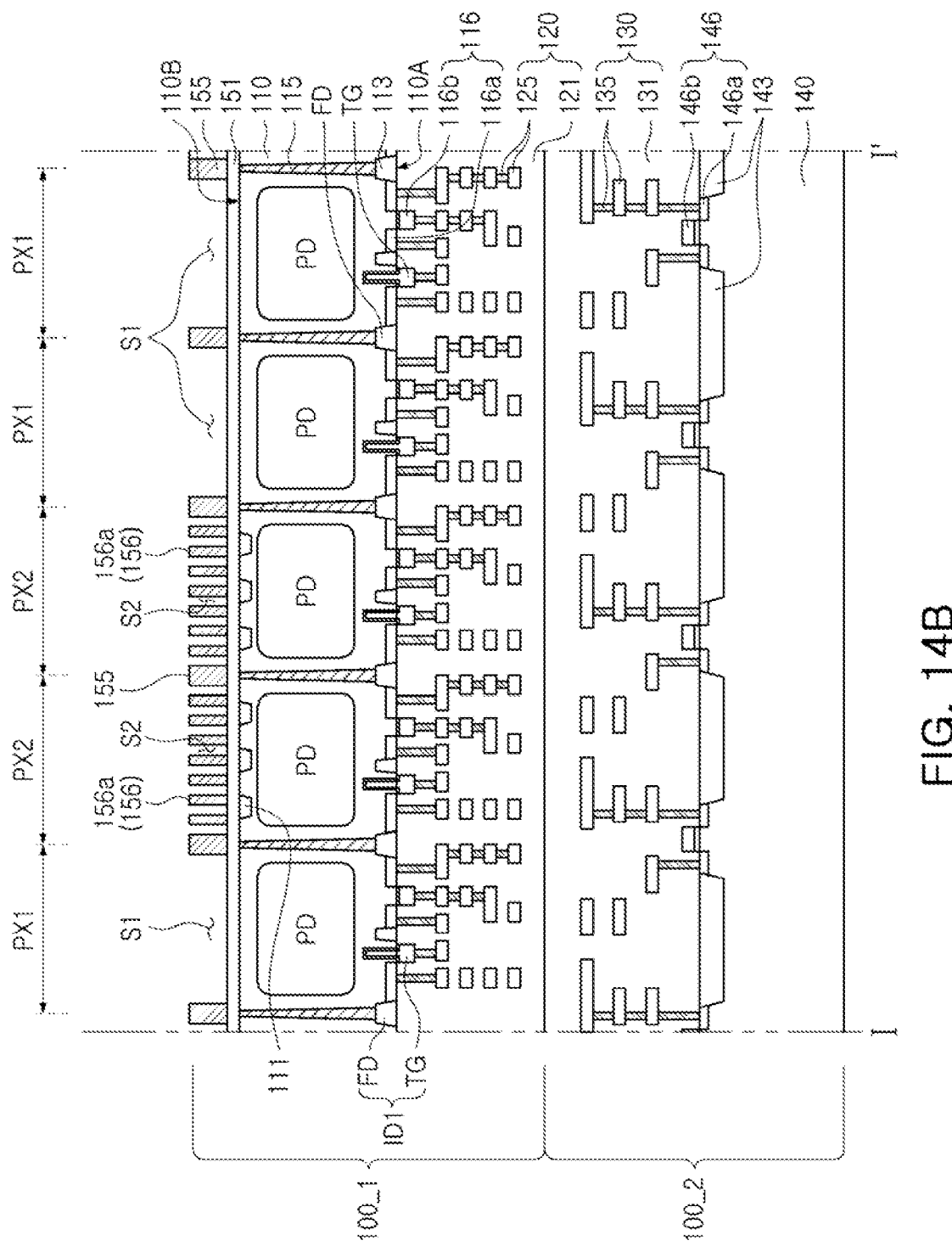

Next, referring to FIG. 14B, after bonding a first wafer for the first chip 100_1 and a second wafer for the second chip 100_2, the insulating layer 151, the grid pattern 155, and the polarization pattern 156 are on the second surface 110B of the first substrate 110.

This bonding process may be implemented as a wafer level process. In the present embodiment, the first and second substrates 110 and 140 may be understood as wafers. The first substrate 110 may be doped with impurities of a first conductivity type, and the photoelectric conversion devices PD may be formed by implanting impurities of a second conductivity type into the first substrate 110. The device isolation region 113 may be on the first surface 110A of the first substrate 110, and the device isolation pattern 115 may have a predetermined depth in the device isolation region 113 to form the pixel regions PX1 and PX2. In an implementation, the device isolation pattern 115 may include polysilicon. To generate an image signal, a floating diffusion region FD, the transfer gate TG, and various transistors may be on the first surface 110B of the first substrate 110. The first wafer for the first chip 100_1 may be manufactured by forming the first wiring structure 120 on the first surface 110B of the first substrate 110. The manufactured first wafer may be bonded to the second wafer for the second chip 1001 for a logic circuit.

The first substrate 110 may be thinned by grinding the first surface 110A of the first substrate 110. The device isolation pattern 115 may be exposed from the first surface 110A of the thinned first substrate 110. The insulating layer 151 may include an anti-reflection layer and/or a planarization layer. In an implementation, the insulating layer 151 may include, e.g., aluminum oxide, hafnium oxide, silicon oxide, or silicon nitride.

The grid pattern 155 may be on the insulating layer 151 to define first and second pixel regions PX1 and PX2. The grid pattern 155 may define first spaces S1 for disposing the color filters CF1, CF2, and CF3. Also, the grid pattern 155 may provide a second space S2 corresponding to the second pixel region PX2 for phase detection. In the present embodiment, the second space S2 may be provided to cover two adjacent pixel regions PX2. In an implementation, the grid pattern 155 may include a metal, such as tungsten. In addition, the polarization pattern 156 may include a high refractive index material, such as TiO₂, a low refractive index material, or tetraethoxysilane (TEOS), or may be an air gap.

The polarization pattern 156 may be in the second pixel regions PX2. The polarization pattern 156 may be formed simultaneously with the grid pattern 155. Any one of the polarization pattern 156 and the grid pattern 155 may be formed first. In an implementation, the polarization pattern 156 may include a metal, such as tungsten. In addition, the polarization pattern 156 may include a high refractive index material, such as TiO₂, a low refractive index material, or tetraethoxysilane (TEOS), or may be an air gap.

Figure 14C:
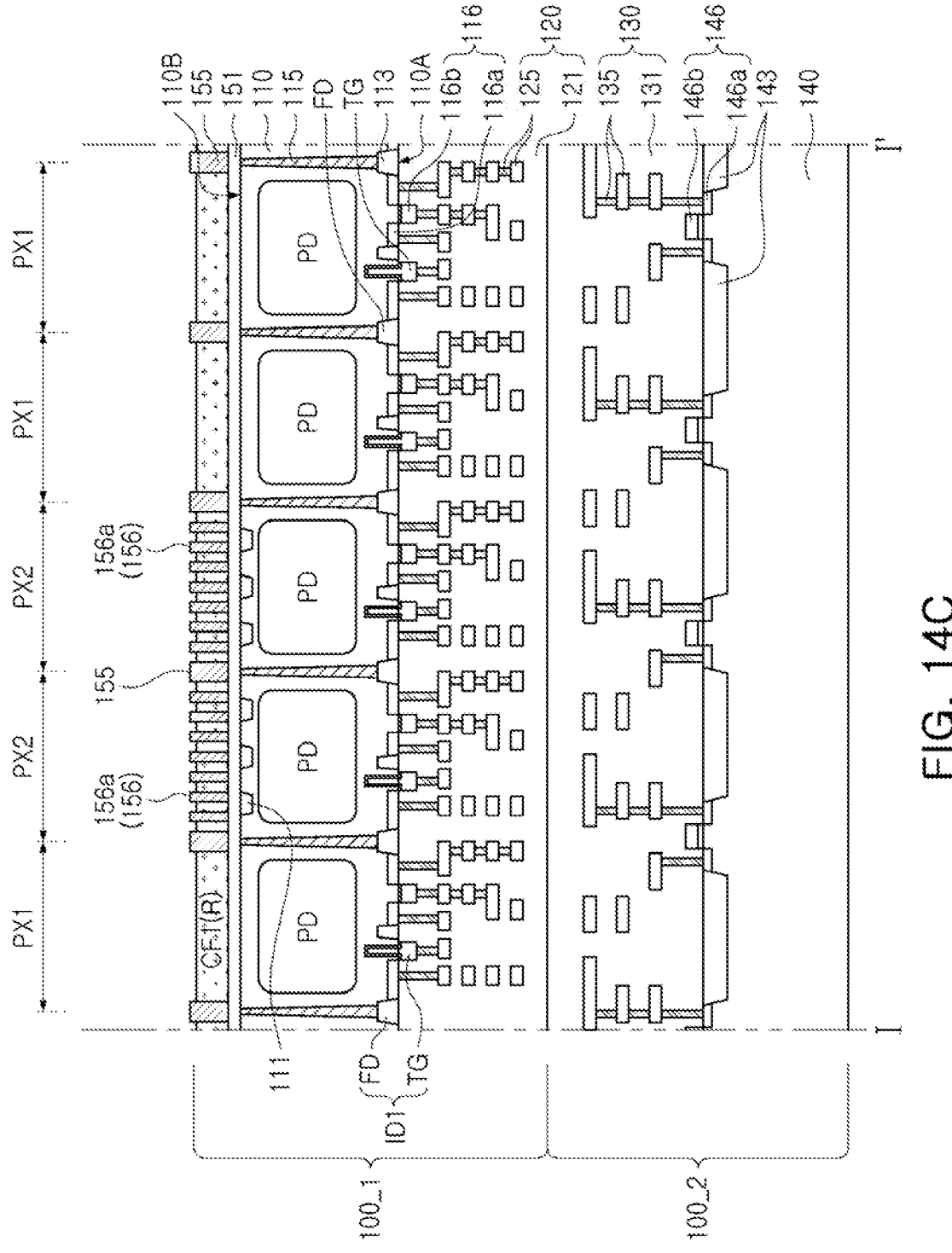
Figure 14D:
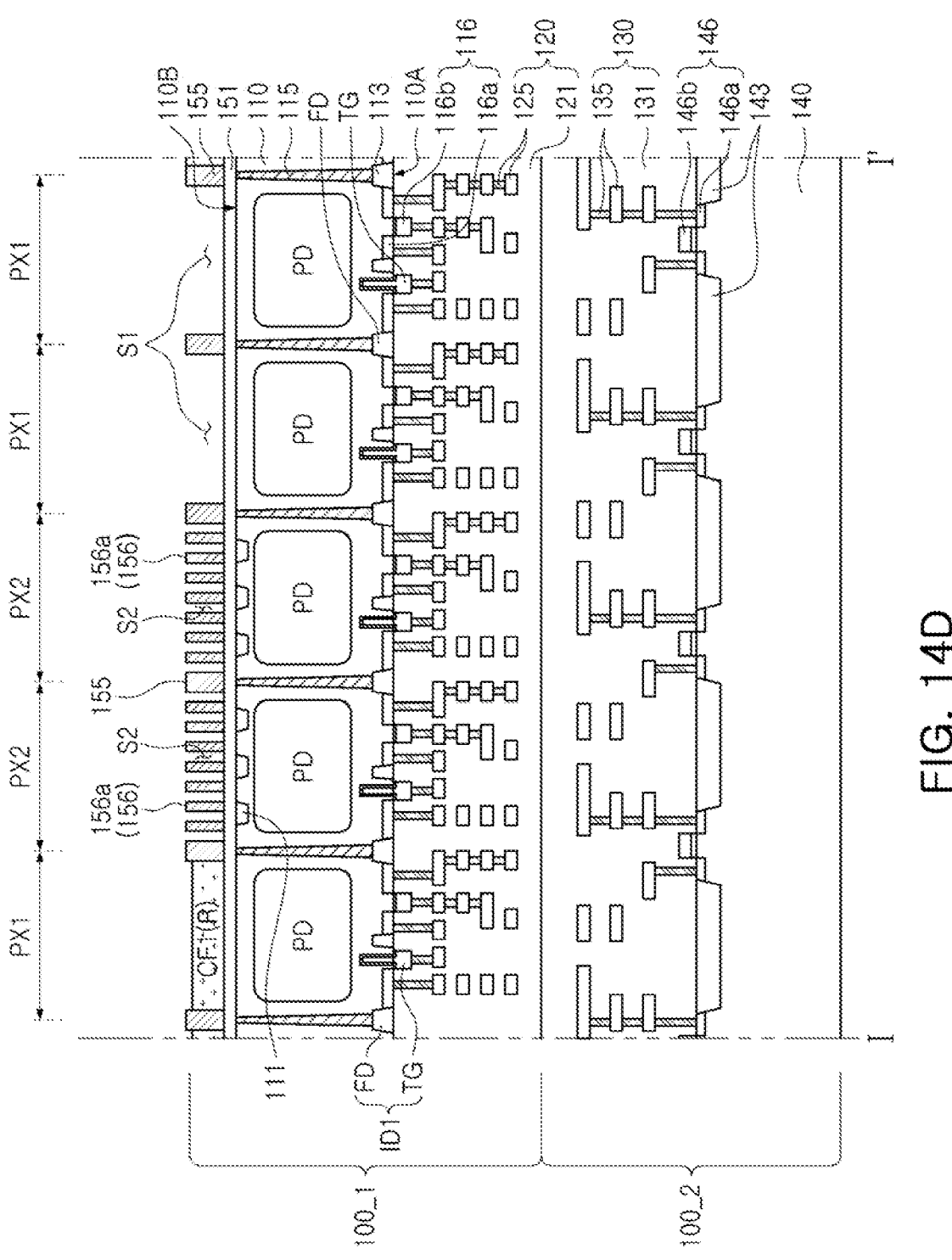

Next, referring to FIG. 14C, a color filter layer CFL for a first color filter may fill the first and second spaces S1 and S2, and then, as illustrated in FIG. 14D, the color filter layer CFL may be patterned to form the first color filter CF1 in the first space S1 of the corresponding pixel region PX1.

The color filter layer CFL may be formed by a coating process, such as spin coating, to fill the first and second spaces S1 and S2. The color filter layer CFL may be a material for the first color filter and may include a filter material allowing light (e.g., blue light) having a first wavelength to transmit therethrough. In an implementation, this filter material may be a resin layer having a dye or pigment having a color filter function. The patterning process of the color filter layer CFL illustrated in FIG. 14D may be performed by exposure and development. Such patterning may remove portions of the color filter layer CFL located in the first space S1 and the second space S2 of the other first pixel regions PX1 of the first substrate 110.

Figure 14E:
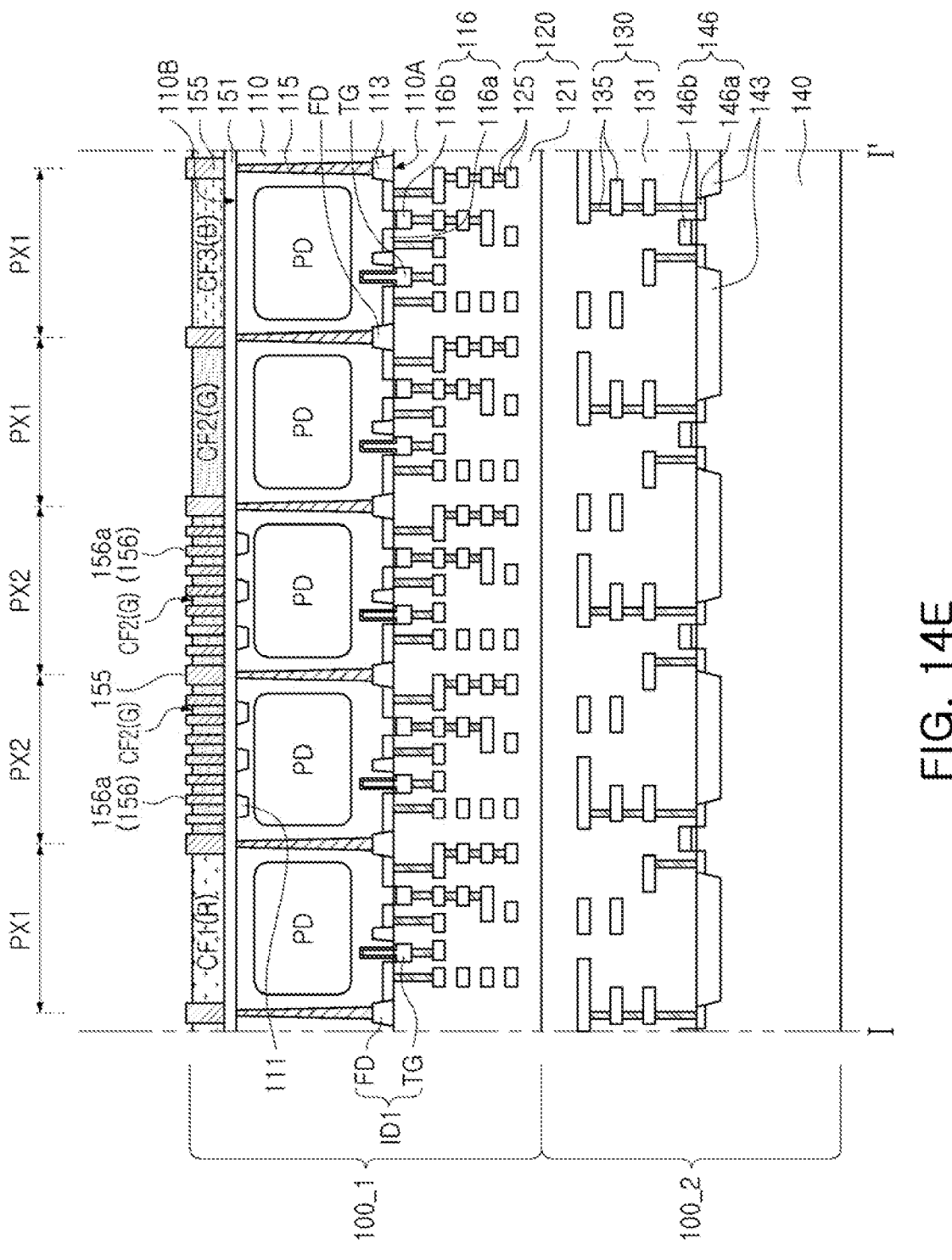

Next, referring to FIG. 14E, similar to the processes illustrated in FIGS. 4B and 4C, the second and third color filters CF2 and CF3 may be formed by processes of coating a color filter layer using a different material and then selectively removing the color filter layer. Through these processes, the second and third color filters CF2 and CF3 may be provided in the first pixel region PX1, and the second color filter CF2 may be provided in the second pixel regions PX2.

Figure 14F:
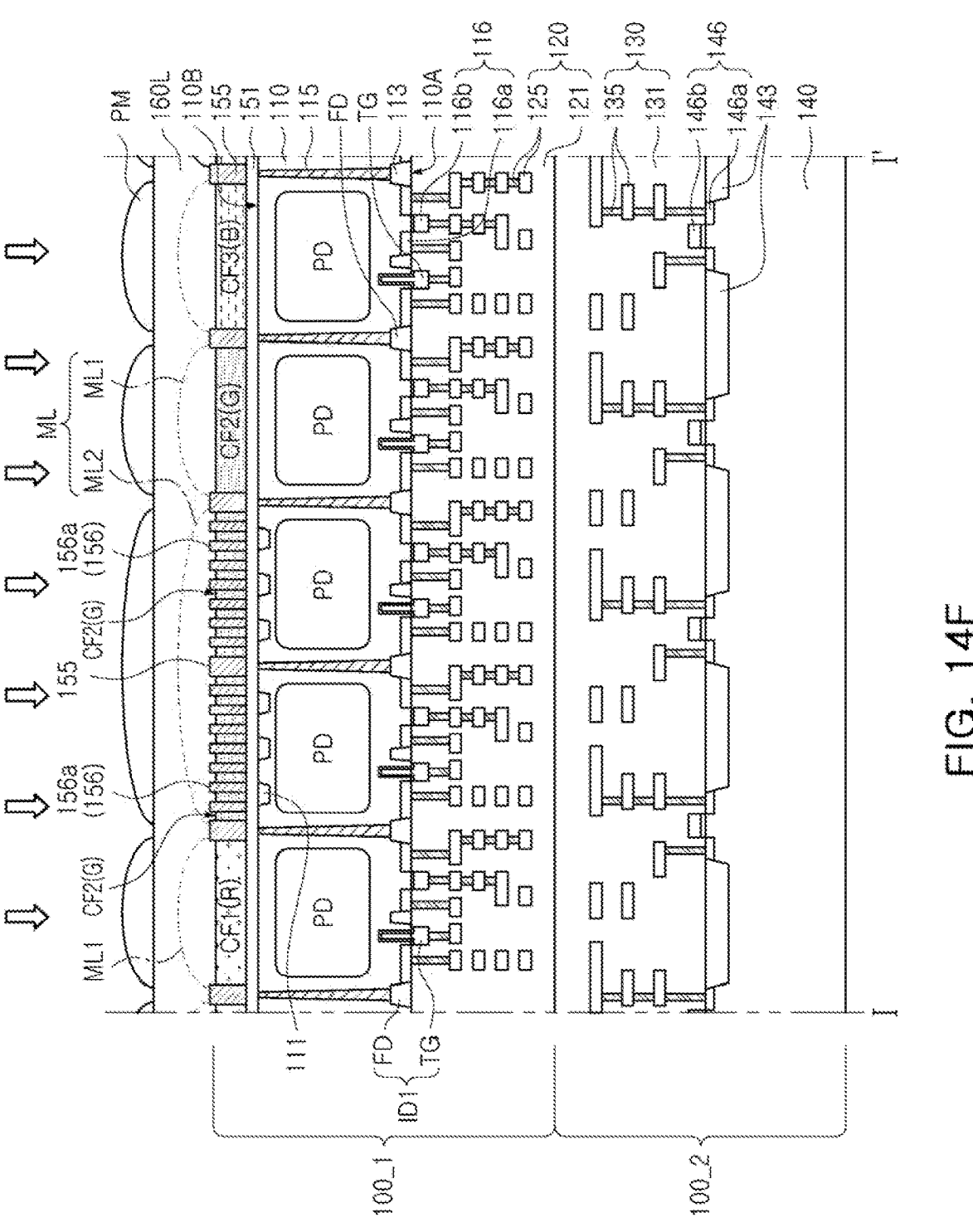

Subsequently, referring to FIG. 14F, a lens material layer 160L may be on the first to third color filters CF1, CF2, and CF3, and then a sacrificial patterns PM having a desired lens shape is on the lens material layer 160L. In an implementation, the lens material layer 160L may be a transparent resin having excellent light transmittance. The lens material layer 160L may have a substantially flat upper surface. In an implementation, the lens material layer 160L may be formed by a spin coating process.

The sacrificial patterns PM may be on the lens material layer 160L and may be worked to have a desired lens shape in each of the pixel regions PX1 and PX2. In the present embodiment, on the second pixel regions PX2, that is, in a region corresponding to the second space S2, the sacrificial patterns PM may have a long lens shape extending over the two second pixel regions PX2. In the process of forming the sacrificial patterns PM, the sacrificial material layer may be formed and then patterned to form the sacrificial patterns PM, and then, the sacrificial patterns PM may be reflowed to have a length shape. Subsequently, by performing an etching process on the lens material layer 160L together with the sacrificial patterns PM, the shape of the sacrificial patterns PM may be transferred to the lens material layer 160L. This etching process may be performed until the sacrificial patterns PM are removed, and the microlens layer 160 indicated by the dotted lines may be formed.

A polarization pattern may be on a phase detection pixel to reduce diffuse reflection of a surface thereof, and a surface area may be increased by forming unevenness portions on a substrate surface of the phase detection pixel, thereby improving light reception capability.

By way of summation and review, an image sensor may include a pixel array, and each pixel included in the pixel array may include a light sensing element. The image sensor is required to perform an autofocusing function so that image capturing may be accurately performed in a short period of time.

An image sensor including phase detection pixels with reduced diffuse reflection and improved sensitivity is disclosed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor comprising:
   a substrate comprising a first surface and a second surface opposing the first surface;
   a plurality of first pixel regions configured to generate image information, wherein the plurality of first pixel regions comprise first to fourth photoelectric conversion devices (PDs);
   a plurality of second pixel regions configured to detect phase information, wherein the plurality of second pixel regions comprise fifth and sixth PDs;
   a first microlens on the first PD;
   a second microlens on the second PD;
   a third microlens on the third PD;
   a fourth microlens on the fourth PD;
   a fifth microlens on the fifth and sixth PDs;
   a first color filter on the second and third PDs; and
   a plurality of patterns between the fifth PD and the fifth microlens and between the sixth PD and the fifth microlens,
   wherein a width of the fifth microlens in a first direction parallel to the second surface in a plan view is greater than each of widths of the first to fourth microlenses in the first direction,
   wherein the first to third PDs, the fifth and sixth PDs, and the fourth PD are sequentially arranged in the first direction, and
   wherein the image sensor is configured to receive light on the second surface.

2. The image sensor as claimed in claim 1, further comprising:
   a second color filter between the fourth PD and the fourth microlens,
   wherein the first color filter is configured to allow light having a first wavelength to be transmitted through the first color filter,
   wherein the second color filter is configured to allow light having a second wavelength to be transmitted through the second color filter, and
   wherein the first wavelength is different from the second wavelength.

3. The image sensor as claimed in claim 2, wherein the first color filter is a red color filter.

4. The image sensor as claimed in claim 2, wherein the plurality of patterns comprise 10 patterns.

5. The image sensor as claimed in claim 2, wherein the plurality of patterns comprise 12 patterns.

6. The image sensor as claimed in claim 2, wherein the second color filter is a green color filter.

7. The image sensor as claimed in claim 1, wherein each of the plurality of patterns has a first width in the first direction and a first height in a second direction perpendicular to the first direction, and
   wherein the first width and the first height are each greater than 0.

8. The image sensor as claimed in claim 7, wherein the plurality of patterns are spaced apart by 20 nm to 300 nm from each other in the first direction.

9. The image sensor as claimed in claim 7, further comprising:
    a device isolation pattern between the sixth PD and the fourth PD; and
    a grid pattern vertically overlapping the device isolation pattern.

10. The image sensor as claimed in claim 9, wherein:
    a width of the grid pattern in the first direction is different from the first width in the first direction.

11. The image sensor as claimed in claim 9, wherein the width of the grid pattern in the first direction is greater than the first width in the first direction.

12. The image sensor as claimed in claim 9, wherein the first height is the same as a height of the grid pattern in the second direction.

13. The image sensor as claimed in claim 9, wherein the first height is lower than a height of the grid pattern in the second direction.

14. The image sensor as claimed in claim 1, wherein the plurality of patterns include tungsten, TiO2, a low-k material, tetraethoxysilane, or an air gap.

15. An image sensor comprising:
    a substrate comprising a first surface and a second surface opposing the first surface;
    a plurality of first pixel regions configured to generate image information, wherein the plurality of first pixel regions comprises first to fourth photoelectric conversion devices (PDs);
    a plurality of second pixel regions configured to detect phase information, wherein the plurality of second pixel regions comprises fifth to eighth PDs;
    a first microlens on the first PD;
    a second microlens on the second PD;
    a third microlens on the third PD;
    a fourth microlens on the fourth PD;
    a fifth microlens on the fifth and sixth PDs;
    a seventh microlens on the seventh and eighth PDs;
    a first color filter on the first PD;
    a second color filter on the fourth PD;
    a plurality of first patterns between the fifth PD and the fifth microlens and between the sixth PD and the fifth microlens; and
    a plurality of second patterns between the seventh PD and the seventh microlens and between the eighth PD and the seventh microlens,
    wherein a width of the fifth microlens in a first direction parallel to the second surface in a plan view is greater than each of widths of the first to fourth microlenses in the first direction, wherein the first to eighth PDs are sequentially arranged in the first direction, and
    wherein the image sensor is configured to receive light on the second surface.

16. The image sensor as claimed in claim 15, wherein the plurality of first patterns comprise 10 patterns.

17. The image sensor as claimed in claim 15, wherein the plurality of first patterns comprise 12 patterns.

18. The image sensor as claimed in claim 15, wherein the plurality of patterns are spaced apart by 20 nm to 300 nm from each other in the first direction.

19. The image sensor of claimed in claim 15, further comprising:
    a device isolation pattern between the sixth PD and the seventh PD; and
    a grid pattern vertically overlapping the device isolation pattern.

20. An image sensor comprising:
    a substrate comprising a first surface and a second surface opposing the first surface;
    a plurality of first pixel regions configured to generate image information, wherein the plurality of first pixel regions comprise a first photoelectric conversion device (PD);
    a plurality of second pixel regions configured to detect phase information, wherein the plurality of second pixel regions comprise second to fifth PDs;
    a first microlens on the first PD;
    a second microlens on the second and third PDs;
    a third microlens on the fourth and the fifth PDs
    a first color filter on the first PD;
    a plurality of first patterns between the second PD and the second microlens and between the third PD and the second microlens; and
    a plurality of second patterns between the fourth PD and the third microlens and between the fifth PD and the third microlens,
    wherein a width of the second microlens in a first direction parallel to the second surface in a plan view is greater than a width of the first microlenses in the first direction,
    wherein the first PD and the second to fifth PDs are sequentially arranged in the first direction,
    wherein, among the plurality of first pixel region, two or more first pixel regions are disposed between the second microlens and the third microlens in a plan view,
    wherein the image sensor is configured to receive light on the second surface.

* * * * *